US011744071B2

(12) United States Patent
Suzuki et al.

(10) Patent No.: US 11,744,071 B2
(45) Date of Patent: Aug. 29, 2023

(54) SEMICONDUCTOR MEMORY DEVICE HAVING A PASSIVATION FILM AND A PLURALITY OF INSULATING PATTERNS ON A MEMORY CELL ARRAY

(71) Applicant: Kioxia Corporation, Tokyo (JP)

(72) Inventors: Gin Suzuki, Yokkaichi (JP); Hiroki Yamashita, Yokkaichi (JP); Yuichiro Fujiyama, Kobe (JP); Takuji Ohashi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 59 days.

(21) Appl. No.: 17/360,174

(22) Filed: Jun. 28, 2021

(65) Prior Publication Data
US 2021/0327899 A1    Oct. 21, 2021

Related U.S. Application Data

(62) Division of application No. 16/553,231, filed on Aug. 28, 2019, now Pat. No. 11,101,285.

(30) Foreign Application Priority Data

Mar. 14, 2019    (JP) .................................. 2019-046988

(51) Int. Cl.
| H01L 29/76 | (2006.01) |
| H10B 43/27 | (2023.01) |
| H01L 23/528 | (2006.01) |
| H10B 41/27 | (2023.01) |
| H10B 41/35 | (2023.01) |
| H10B 43/35 | (2023.01) |

(52) U.S. Cl.
CPC ......... *H10B 43/27* (2023.02); *H01L 23/5283* (2013.01); *H10B 41/27* (2023.02); *H10B 41/35* (2023.02); *H10B 43/35* (2023.02)

(58) Field of Classification Search
CPC ........... H01L 27/11582; H01L 23/5283; H01L 27/11524; H01L 27/11556; H01L 27/1157; H10B 43/27; H10B 43/35; H10B 41/27; H10B 41/35
USPC ....................................................... 257/314
See application file for complete search history.

(56) References Cited

U.S. PATENT DOCUMENTS 9,978,769 B2    5/2018  Shimura
2009/0267128 A1  10/2009  Maejima
(Continued)

FOREIGN PATENT DOCUMENTS

JP    2018-046167 A    3/2018

*Primary Examiner* — Phuc T Dang
(74) *Attorney, Agent, or Firm* — Oblon, McClelland, Maier & Neustadt, L.L.P.

(57) ABSTRACT

According to one embodiment, a semiconductor memory device includes a memory cell array; a first insulating layer; and a passivation film. The memory cell array includes first interconnect layers and a first memory pillar. The first interconnect layers extend in a first direction substantially parallel to a semiconductor substrate. The first memory pillar passes through the first interconnect layers and extends in a second direction substantially perpendicular to the semiconductor substrate. The first insulating layer is provided above the memory cell array. The passivation film is provided on the first insulating layer, and includes a protrusion at least above the memory cell array and between the passivation film and the first insulating layer.

8 Claims, 27 Drawing Sheets

(56) References Cited

U.S. PATENT DOCUMENTS

| | | |
|---|---|---|
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2012/0032246 A1 | 2/2012 | Honda |
| 2015/0062993 A1* | 3/2015 | Tanaka .............. H01L 21/76897 |
| | | 365/63 |
| 2015/0263024 A1 | 9/2015 | Hishida |
| 2016/0149002 A1 | 5/2016 | Sharangpani et al. |
| 2016/0300845 A1 | 10/2016 | Ishizaki |
| 2017/0069754 A1 | 3/2017 | Iinuma et al. |
| 2017/0213833 A1 | 7/2017 | Godo |
| 2017/0263634 A1 | 9/2017 | Inokuma et al. |
| 2017/0271345 A1 | 9/2017 | Shimura |
| 2017/0309634 A1 | 10/2017 | Noguchi et al. |
| 2018/0164680 A1 | 6/2018 | Mitra |
| 2018/0269225 A1 | 9/2018 | Huang et al. |
| 2019/0067308 A1* | 2/2019 | Yun ................... H01L 27/11529 |
| 2019/0088587 A1* | 3/2019 | Take ................... H01L 23/5226 |
| 2019/0157284 A1* | 5/2019 | Park .................. H01L 27/11582 |
| 2019/0172840 A1 | 6/2019 | Song |

* cited by examiner

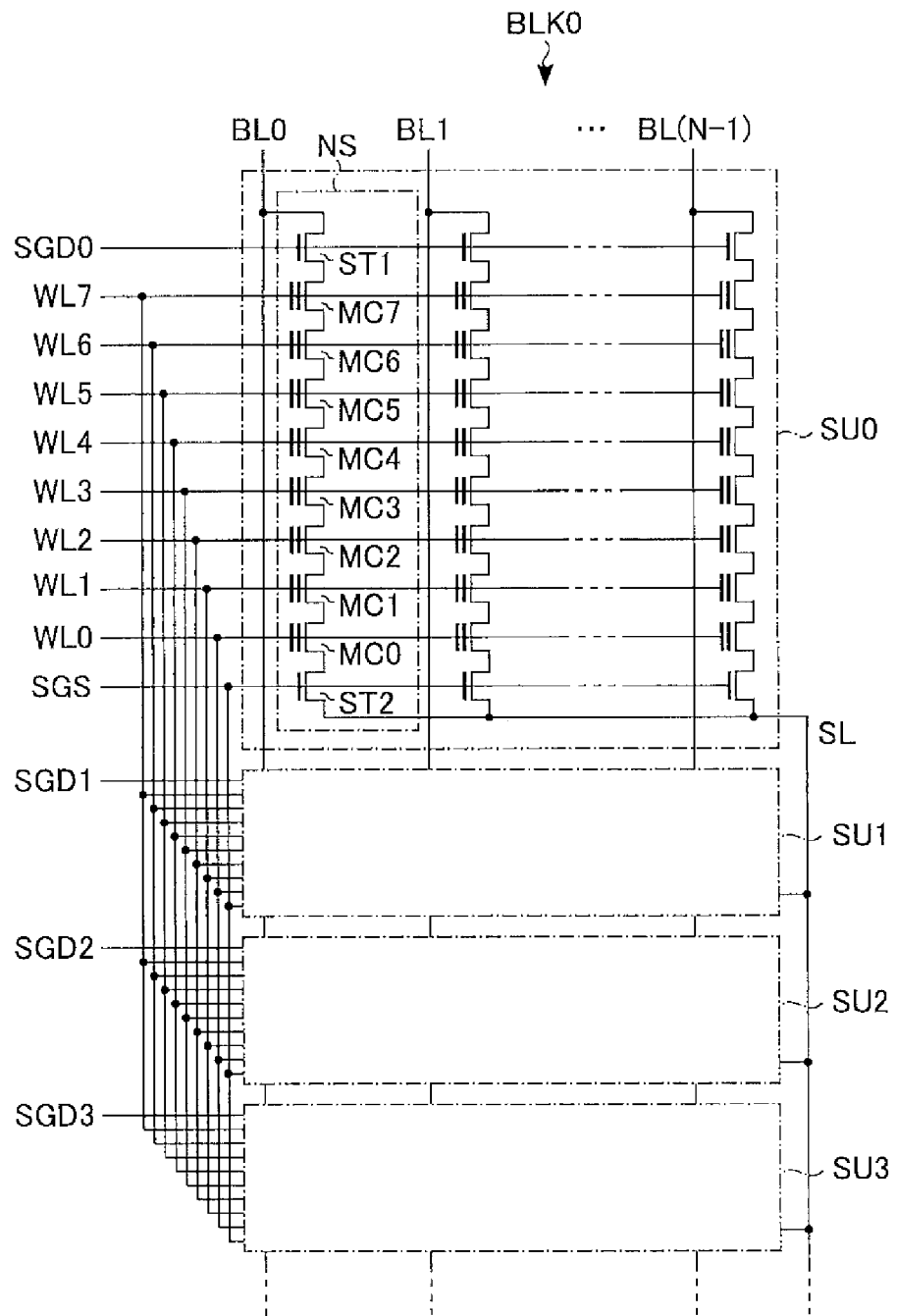
F I G. 2

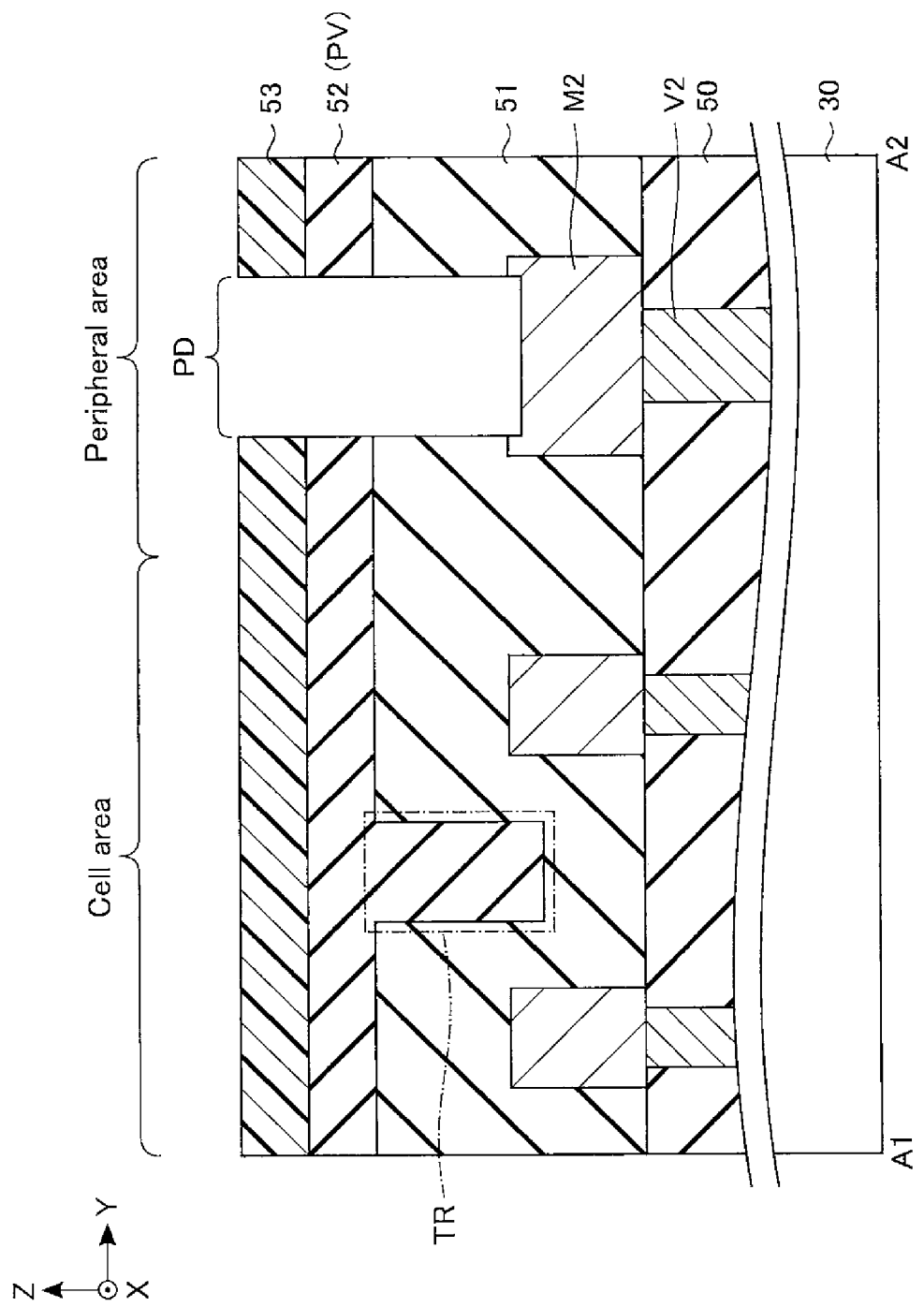
F I G. 5

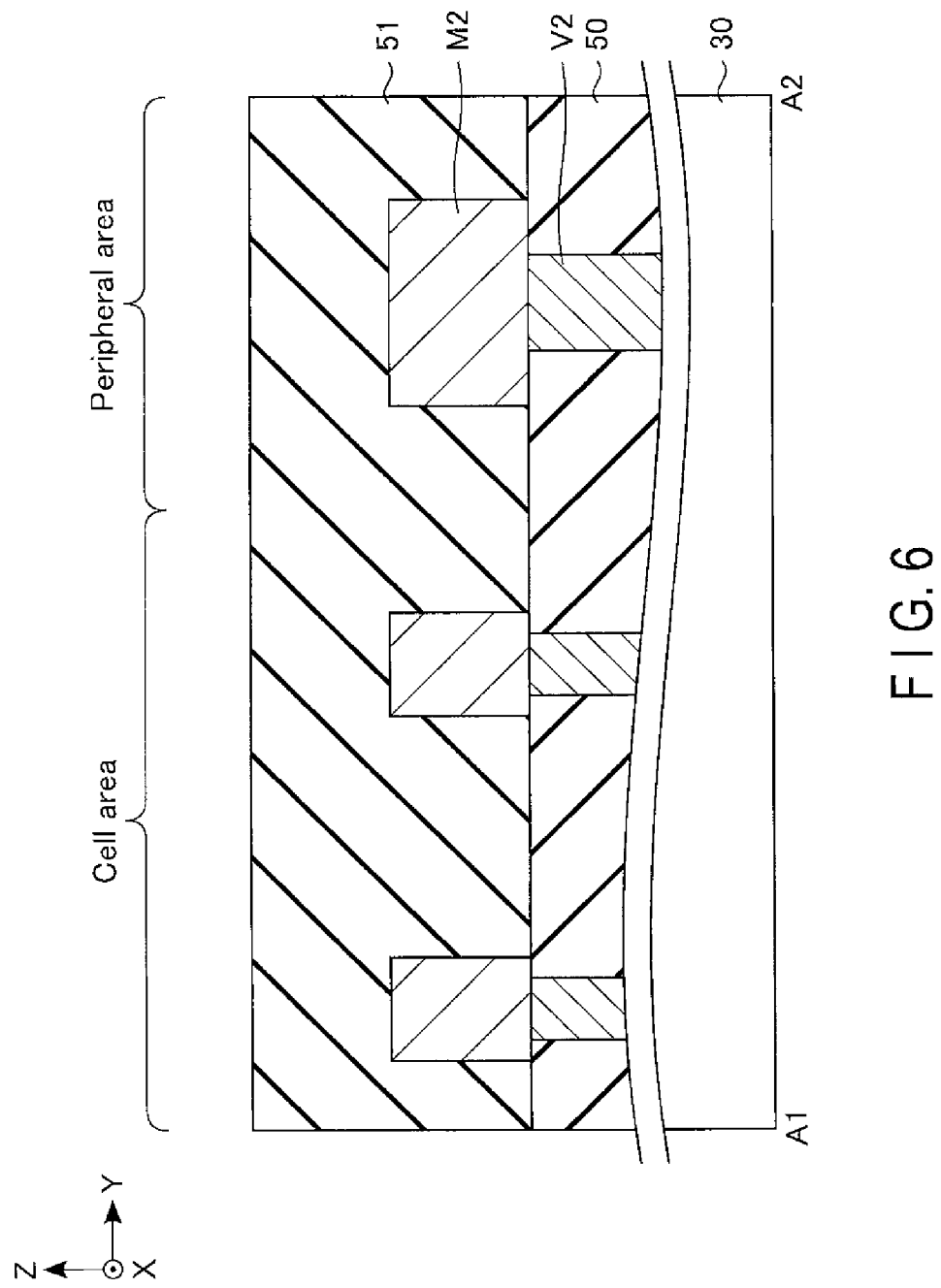
F I G. 6

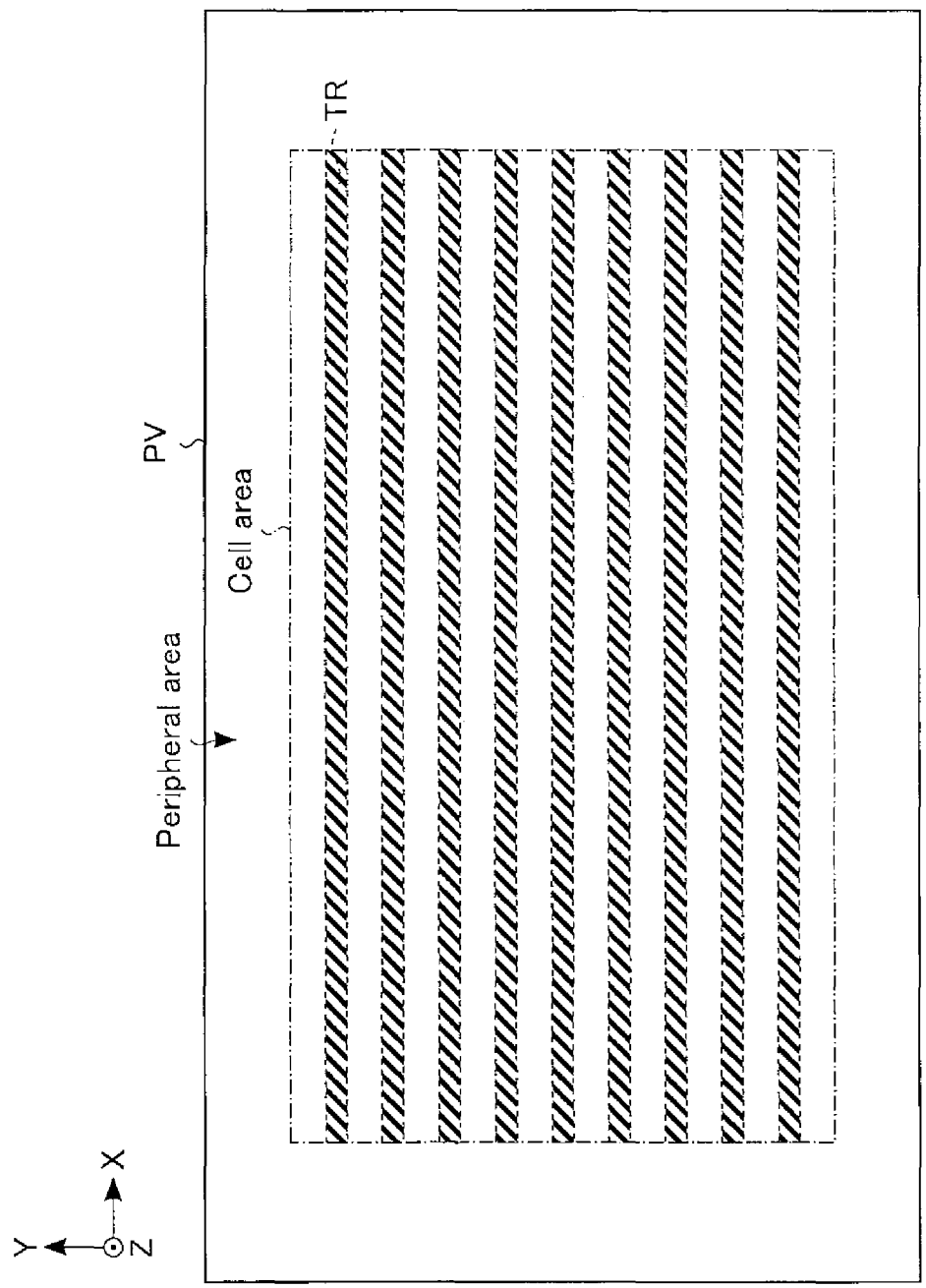
F I G. 9

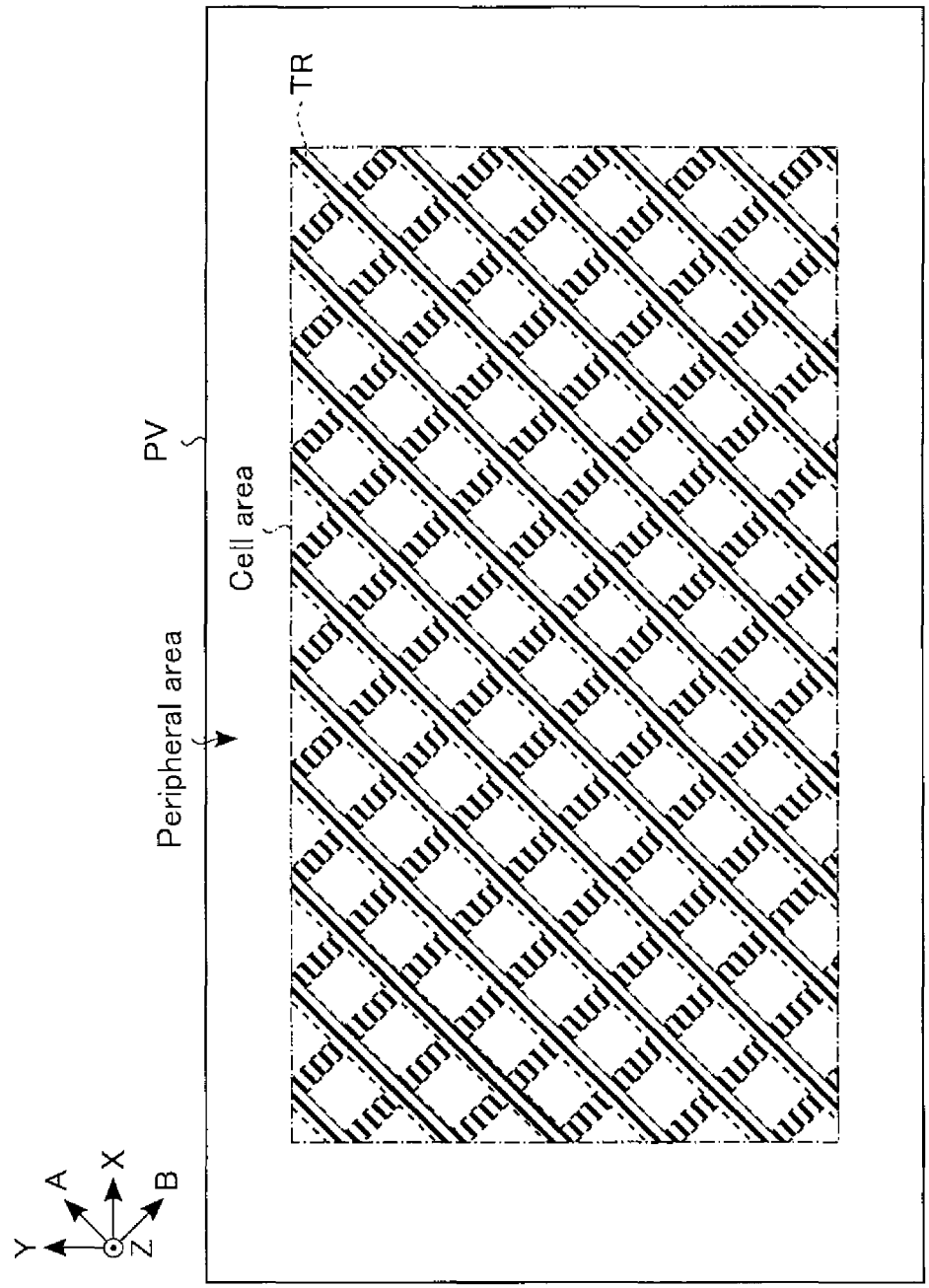
F I G. 10

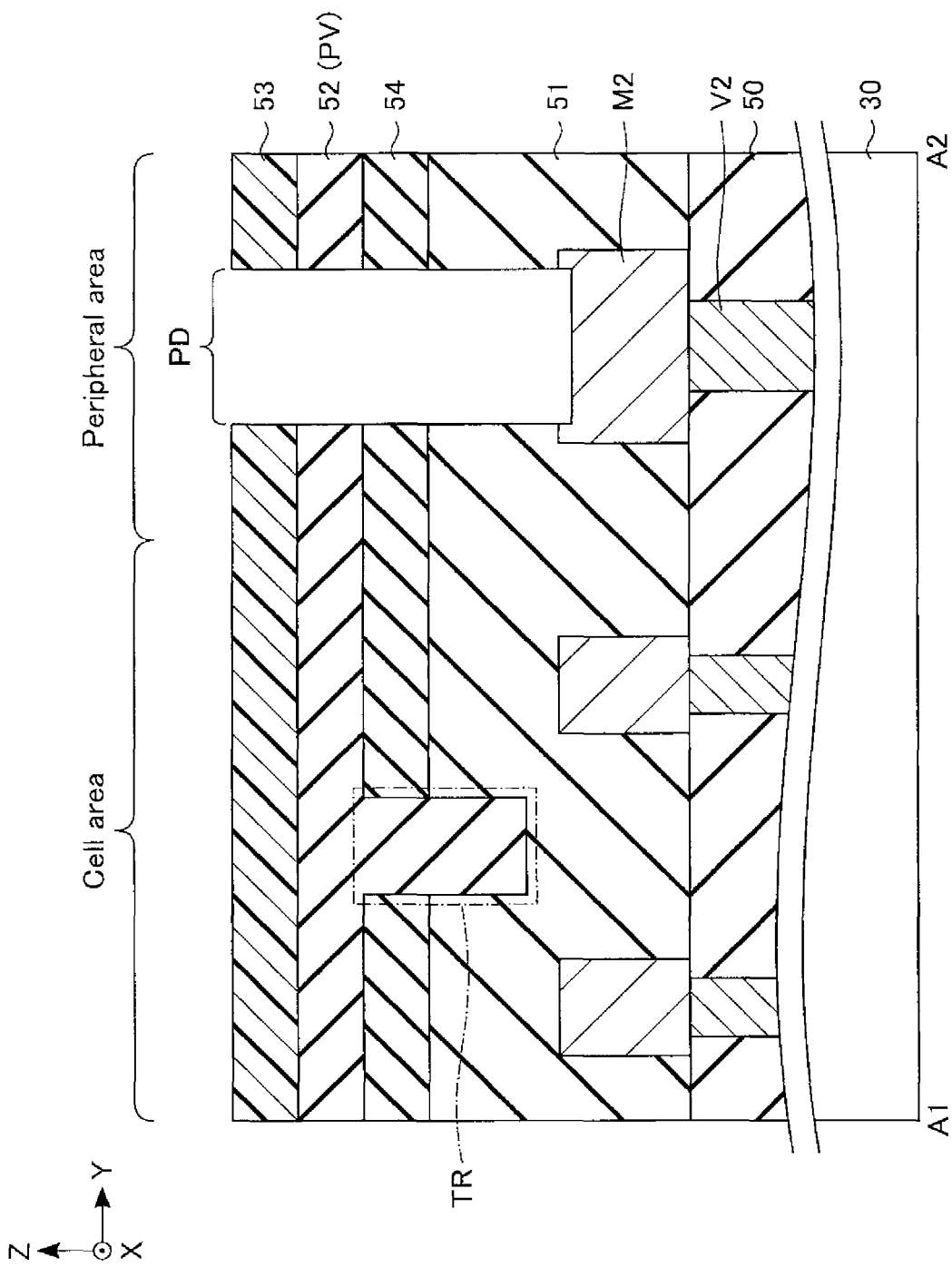
F I G. 12

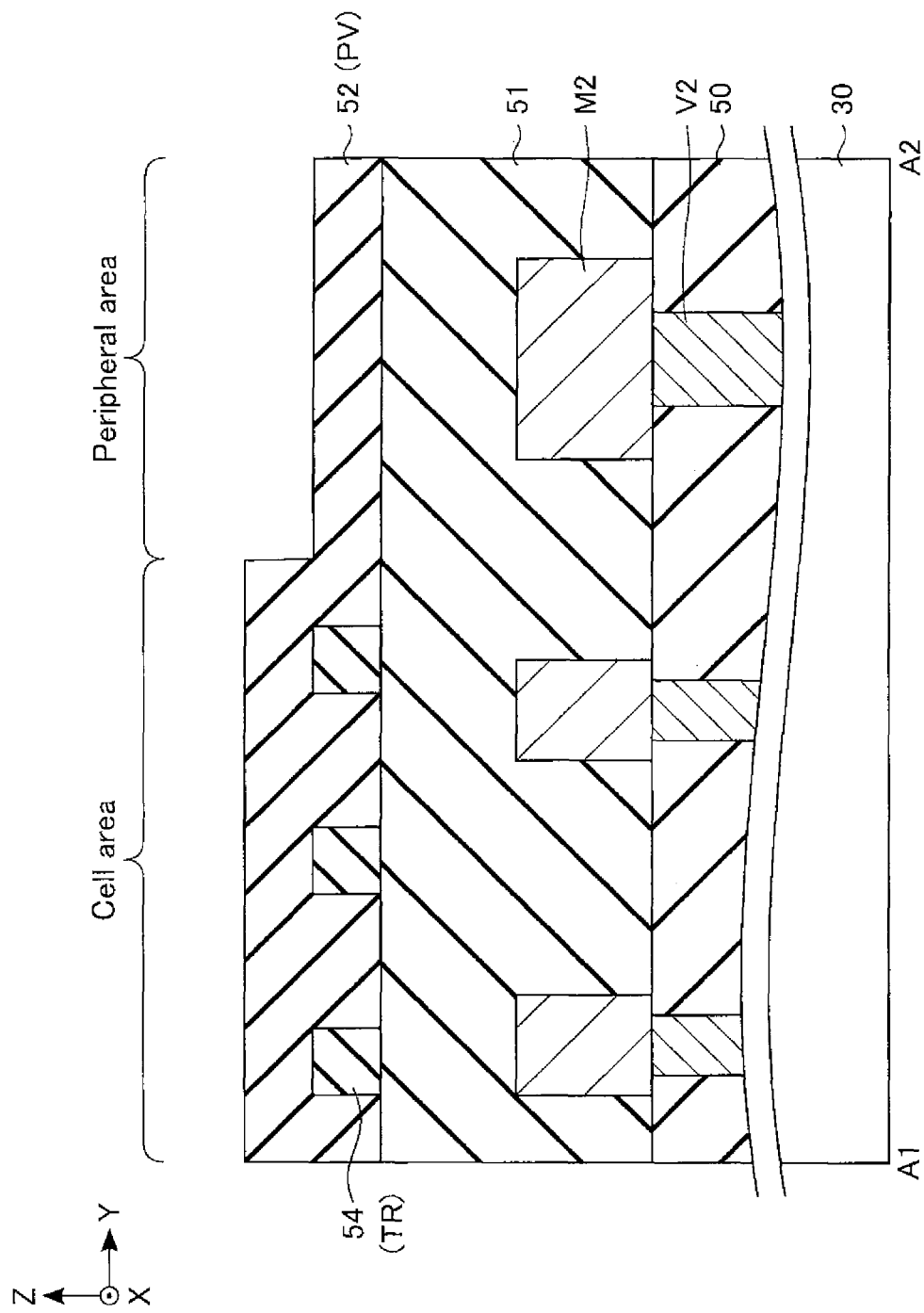
F I G. 19

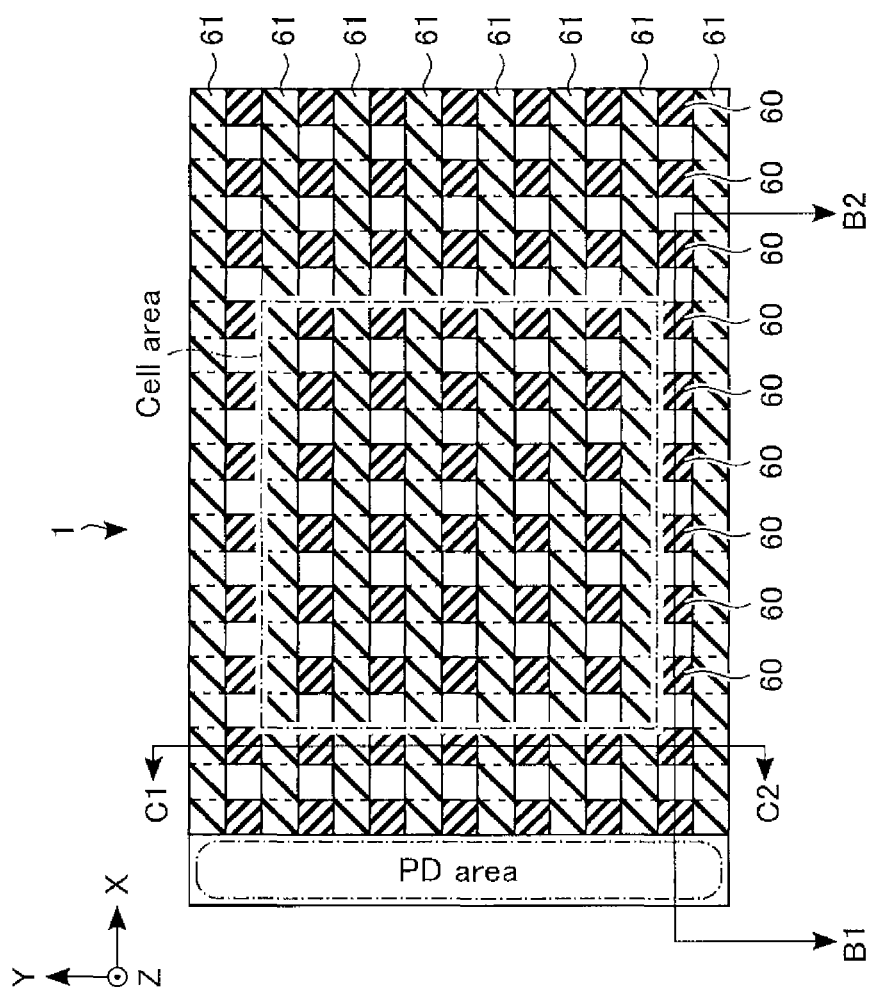
F I G. 21

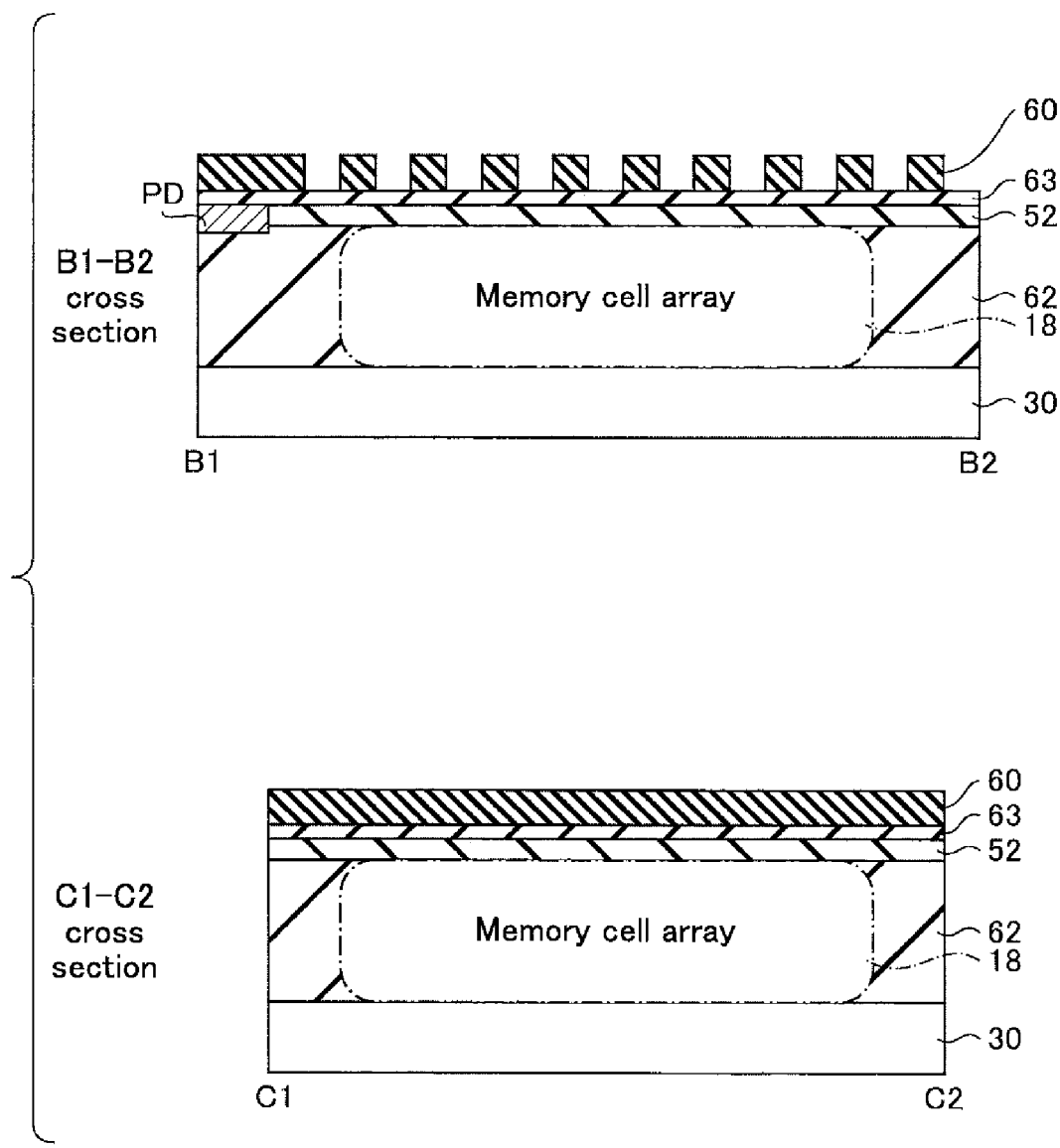
F I G. 25

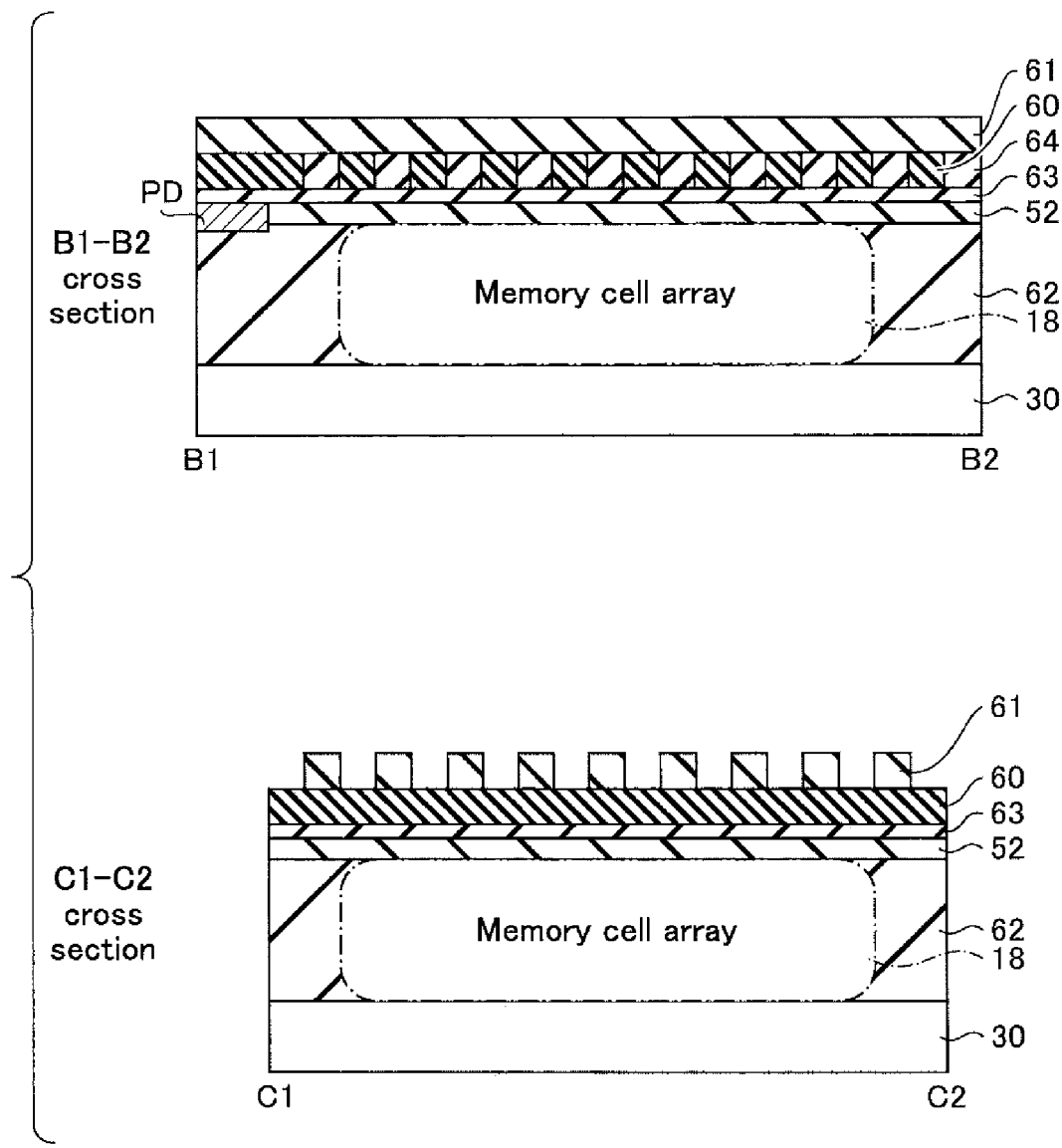
F I G. 26

SEMICONDUCTOR MEMORY DEVICE HAVING A PASSIVATION FILM AND A PLURALITY OF INSULATING PATTERNS ON A MEMORY CELL ARRAY

CROSS-REFERENCE TO RELATED APPLICATIONS

This application is a Divisional of U.S. application Ser. No. 16/553,231 (now U.S. Pat. No. 11,101,285), filed Aug. 28, 2019, and is based upon and claims the benefit of priority from Japanese Patent Application No. 2019-046988, filed Mar. 14, 2019, the entire contents of each of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 2 is a circuit diagram of a memory cell array included in the semiconductor memory device according to the first embodiment;

FIG. 5 is a cross-sectional view of the semiconductor memory device according to the first embodiment;

FIGS. 6 to 8 are diagrams illustrating a process for manufacturing the semiconductor memory device according to the first embodiment;

FIG. 9 is a plan view of a cover insulation film included in a semiconductor memory device according to a first example of a second embodiment;

FIG. 10 is a plan view of a cover insulation film included in a semiconductor memory device according to a second example of the second embodiment;

FIG. 12 is a cross-sectional view of a semiconductor memory device according to a third embodiment;

FIGS. 18 and 19 are diagrams illustrating a process for manufacturing the semiconductor memory device according to the fifth embodiment;

FIG. 21 is a plan view of the semiconductor memory device according to the sixth embodiment;

FIGS. 24 to 27 are diagrams illustrating a process for manufacturing the semiconductor memory device according to the sixth embodiment.

DETAILED DESCRIPTION

In general, according to one embodiment, a semiconductor memory device includes a memory cell array; a first insulating layer; and a passivation film. The memory cell array includes a plurality of first interconnect layers and a first memory pillar. The first interconnect layers extend in a first direction substantially parallel to a semiconductor substrate. The first memory pillar passes through the first interconnect layers and extends in a second direction substantially perpendicular to the semiconductor substrate. The first insulating layer is provided above the memory cell array. The passivation film is provided on the first insulating layer, and includes a protrusion at least above the memory cell array and between the passivation film and the first insulating layer.

1. First Embodiment

A semiconductor memory device according to the first embodiment will be described. Hereinafter, a three-dimensional stacked NAND flash memory with memory cell transistors three-dimensionally stacked on a semiconductor substrate will be described as an example of the semiconductor memory device.

1.1. Configuration

1.1.1. Configuration of Semiconductor Memory Device

First, an example of the overall configuration of a semiconductor memory device 1 will be described with reference to FIG. 1. In the example shown in FIG. 1, some of the couplings between blocks are indicated by arrows; however, the couplings between the blocks are not limited to those shown in FIG. 1.

Figure 1:
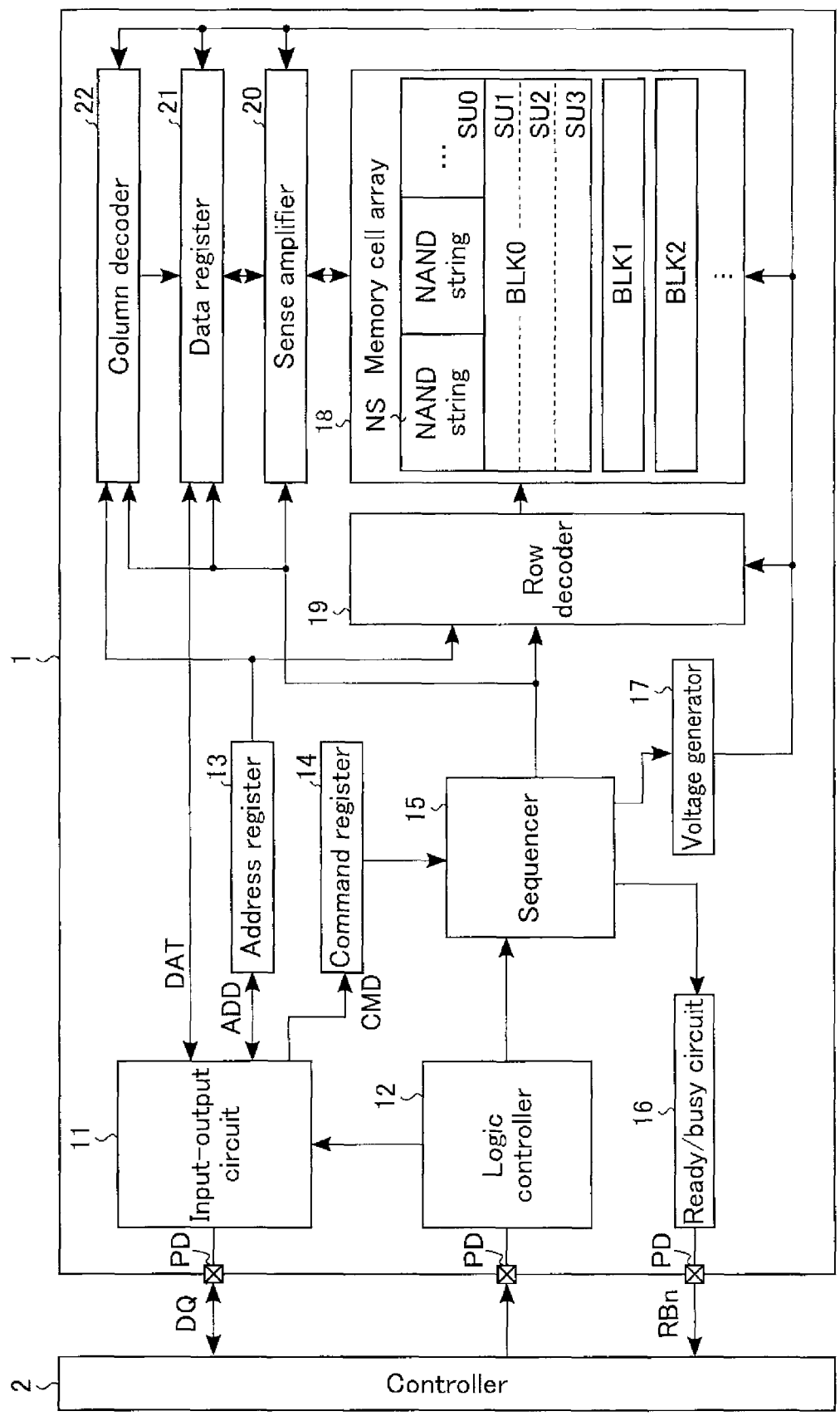
FIG. 1 is a block diagram of a semiconductor memory device according to a first embodiment.

As shown in FIG. 1, the semiconductor memory device 1 includes an input-output circuit 11, a logic controller 12, an address register 13, a command register 14, a sequencer 15, a ready/busy circuit 16, a voltage generator 17, a memory cell array 18, a row decoder 19, a sense amplifier 20, a data register 21, and a column decoder 22.

The input-output circuit 11 is coupled to a controller 2 via electrode pads PD and controls input and output of a signal DQ to and from the controller 2.

The electrode pads PD are input-output terminals electrically coupled to an external device. The semiconductor memory device 1 performs inputting and outputting of various signals via the electrode pads PD. The electrode pads PD are arranged in an area not including the memory cell array 18 (hereinafter referred to as a "peripheral area") on the XY-plane that is substantially parallel to a semiconductor substrate.

The signal DQ includes, for example, data DAT, an address ADD, and a command CMD. More specifically, the input-output circuit 11 transmits the data DAT received from the controller 2 to the data register 21, transmits the address ADD received from the controller 2 to the address register 13, and transmits the command CMD received from the controller 2 to the command register 14. Also, the input-output circuit 11 transmits, to the controller 2, the data DAT received from the data register 21, the address ADD received from the address register 13, and the like.

The logic controller 12 is coupled to the controller 2 via the electrode pads PD and receives various control signals from the controller 2. The logic controller 12 controls the input-output circuit 11 and the sequencer 15 according to the received control signals.

The address register 13 temporarily holds the received address ADD. The address register 13 transfers a row address to the row decoder 19, and transfers a column address to the column decoder 22.

The command register 14 temporarily stores the received command CMD, and transfers the received command CMD to the sequencer 15.

The sequencer 15 controls the operation of the entire semiconductor memory device 1. More specifically, the sequencer 15 controls, for example, the ready/busy circuit 16, the voltage generator 17, the row decoder 19, the sense amplifier 20, the data register 21, and the column decoder 22 in response to the received command CMD, and performs a write operation, a read operation, an erase operation, and the like.

The ready/busy circuit 16 is coupled to the controller 2 via the electrode pad PD and transmits a ready/busy signal RBn to the controller 2 based on the operation state of the sequencer 15.

In accordance with the control exerted by the sequencer 15, the voltage generator 17 generates voltages used in a write operation, a read operation, and an erase operation, and supplies the generated voltages to, for example, the memory cell array 18, the row decoder 19, the sense amplifier 20, the data register 21, and the column decoder 22. The row decoder 19 and the sense amplifier 20 apply the voltages supplied by the voltage generator 17 to the memory cell transistors in the memory cell array 18.

The memory cell array 18 includes a plurality of blocks BLK (BLK0, BLK1, BLK2, ... ), each of which includes a plurality of nonvolatile memory cell transistors (hereinafter also referred to as "memory cells") associated with rows and columns. Each of the blocks BLK includes a plurality of (four in the present embodiment) string units SU (SU0 to SU3), each of which is a set of NAND strings NS, in each of which in turn memory cell transistors are coupled in series. Details of the memory cell array 18 will be described later.

The row decoder 19 decodes the row address. The row decoder 19 applies voltages used to the memory cell array 18 based on a result of the decoding.

In a read operation, the sense amplifier 20 senses data read from the memory cell array 18. The sense amplifier 20 transmits the read data to the data register 21. In a write operation, the sense amplifier 20 transmits write data to the memory cell array 18.

The data register 21 includes a plurality of latch circuits. The latch circuits temporarily hold write data or read data.

The column decoder 22 decodes a column address during write, read, and erase operations, for example, and selects a latch circuit in the data register 21 based on a result of the decoding.

1.1.2. Configuration of Memory Cell Array

Next, a configuration of the memory cell array 18 will be described with reference to FIG. 2. The example in FIG. 2 shows a configuration of the block BLK0; however, the other blocks BLK have the same configuration.

As shown in FIG. 2, the block BLK0 includes, for example, four string units SU0 to SU3. Each of the string units SU includes a plurality of NAND strings NS. Each of the NAND strings NS includes, for example, eight memory cell transistors MC (MC0 to MC7), and select transistors ST1 and ST2. Each memory cell transistor MC includes a control gate and a charge storage layer, and holds data in a nonvolatile manner. Hereinafter, the memory cell transistors MC0 to MC7 will be referred to as "memory cell transistors MC," unless one of them is specifically specified.

The memory cell transistors MC may be of a MONOS type that uses an insulating film as the charge storage layer, or an FG type that uses a conductive layer as the charge storage layer. In the present embodiment, a MONOS-type memory cell transistor will be described as an example. The number of memory cell transistors MC included in one NAND string NS is not limited to eight, and may be 16, 32, 64, 96, or 128, etc. The example in FIG. 2 illustrates a case where one select transistor ST1 and one select transistor ST2 are included in one NAND string NS; however, at least one select transistor ST1 and one select transistor ST2 may be included in one NAND string.

In the NAND string NS, the current paths of the select transistor ST2, the memory cell transistors MC0 through MC7, and the select transistor ST1 are coupled in series in the mentioned order. The drain of the select transistor ST1 is coupled to a corresponding bit line BL. The source of the select transistor ST2 is coupled to a source line SL.

The control gates of the memory cell transistors MC0 through MC7 of each of the NAND strings NS in the same block BLK are coupled in common to word lines WL0 through WL7, respectively. More specifically, the control gates of the plurality of memory cell transistors MC0 in the block BLK, for example, are coupled in common to the word line WL0.

The gates of the select transistors ST1 of the plurality of NAND strings NS in the same string unit SU are coupled in common to a select gate line SGD. More specifically, the gates of the plurality of select transistors ST1 in the string unit SU0 are coupled to a select gate line SGD0. The gates of the plurality of select transistors ST1 (not shown) in the string unit SU1 are coupled to a select gate line SGD1. The gates of the plurality of select transistors ST1 (not shown) in the string unit SU2 are coupled to a select gate line SGD2. The gates of the plurality of select transistors ST1 (not shown) in the string unit SU3 are coupled to a select gate line SGD3. Hereinafter, the select gate lines SGD0 to SGD3 will be referred to as "select gate lines SGD," unless one of them is specifically specified.

The gates of the plurality of select transistors ST2 in the same block BLK are coupled in common to a select gate line SGS. The gates of the select transistors ST2 may be coupled to different select gate lines SGS for the each string unit SU.

The drains of the plurality of select transistors ST1 in a string unit SU are coupled to different bit lines BL (BL0 to BL(N−1), where N is a natural number of two or greater). Namely, the plurality of NAND strings NS in a string unit SU are coupled to different bit lines BL. Each bit line BL couples together its corresponding NAND strings NS in the string units SU0 through SU3 in each block BLK.

The sources of the select transistors ST2 in the plurality of blocks BLK are coupled in common to the source line SL.

Namely, each string unit SU is a set of NAND strings NS coupled to different bit lines BL and coupled to the same select gate line SGD. Each block BLK is a set of string units SU that share the word lines WL. The memory cell array 18 is a set of blocks BLK that share the bit lines BL.

The memory cell array 18 may have other configurations. That is, the configuration of the memory cell array 18 is described, for example, in U.S. patent application Ser. No. 12/407,403 entitled "THREE DIMENSIONAL STACKED NONVOLATILE SEMICONDUCTOR MEMORY" filed on Mar. 19, 2009. The configuration of the memory cell array 18 is also described in U.S. patent application Ser. No. 12/406,524 entitled "THREE DIMENSIONAL STACKED NONVOLATILE SEMICONDUCTOR MEMORY" filed on Mar. 18, 2009, in U.S. patent application Ser. No. 12/679,991 entitled "NON-VOLATILE SEMICONDUCTOR STORAGE DEVICE AND METHOD OF MANUFACTURING THE SAME" filed on Mar. 25, 2010, and in U.S. patent application Ser. No. 12/532,030 entitled "SEMICONDUCTOR MEMORY AND METHOD FOR MANUFACTURING SAME" filed on Mar. 23, 2009. The entire contents of these applications are incorporated herein for purposes of reference.

1.1.3. Configuration of Memory Cell Array

Next, the configuration of the memory cell array 18 will be described with reference to FIG. 3, which is a cross-sectional view of the memory cell array 18. In the example shown in FIG. 3, some of the insulating layers are omitted.

Figure 3:
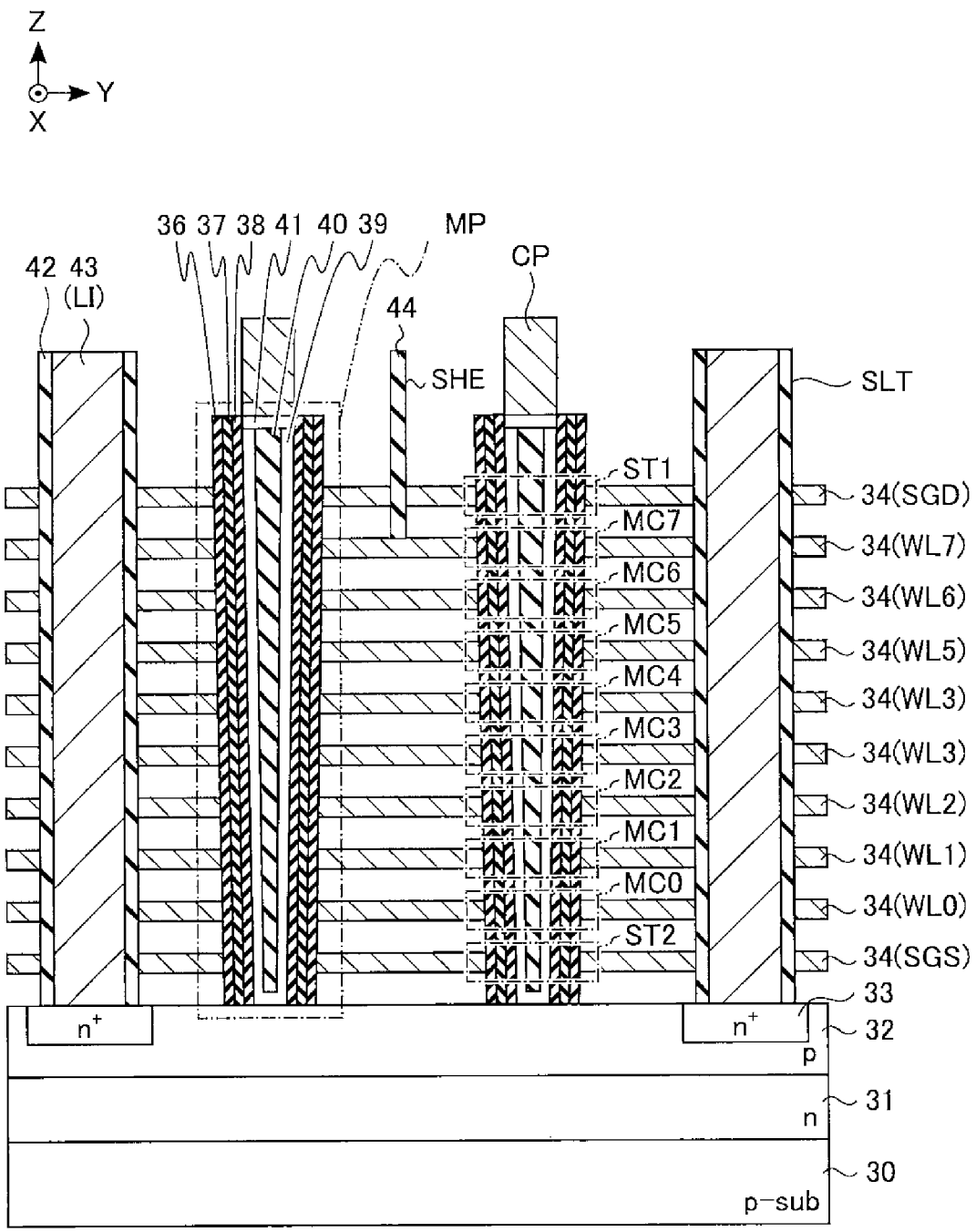
FIG. 3 is a cross-sectional view of the memory cell array included in the semiconductor memory device according to the first embodiment.

As shown in FIG. 3, ten interconnect layers 34 that function as the select gate line SGS, the word lines WL0 through WL7, and the select gate line SGD, are stacked, with a space interposed therebetween, in a Z-direction that is substantially perpendicular to the semiconductor substrate 30. The interconnect layers 34 extend in a X-direction that is substantially parallel to the semiconductor substrate 30 and substantially perpendicular to the Z-direction. Each of the interconnect layers 34 is separated for each block BLK, for example, in a Y-direction that is substantially parallel to the semiconductor substrate 30 and substantially perpendicular to the X-direction, by a slit SLT extending in the X-direction. In the present embodiment, a case where a source line contact LI is formed in the slit SLT will be described. The source line contact LI couples the semiconductor substrate 30 and a source line SL (not shown) that is arranged above memory pillars MP. The uppermost interconnect layer 34, which functions as the select gate line SGD, is further separated in the Y-direction for each string unit SU by, for example, a slit SHE, which extends in the X-direction between two slits SLT.

Between two slits SLT as viewed in the Y-direction, a plurality of memory pillars MP passing through the ten interconnect layers 34 and extending in the Z-direction are arranged along the X-direction. One memory pillar MP corresponds to one NAND string NS. The memory pillars MP will be detailed later. The arrangement of the memory pillars MP between two slits SLT is discretionary. For example, the memory pillars MP may be staggered in four rows along the X-direction.

More specifically, an n-type well 31 is provided in a surface area of the semiconductor substrate (p-type semiconductor substrate) 30. A p-type well 32 is provided in a surface area of the n-type well 31. $N^+$-type diffusion layers 33 are provided in a part of the surface area of the p-type well 32. The ten interconnect layers 34 functioning as the select gate line SGS, the word lines WL0 to WL7, and the select gate line SGD are stacked above the p-type well 32.

A semiconductor material such as an n-type semiconductor or a p-type semiconductor, or a metal material such as tungsten (W) is used for the interconnect layers 34 functioning as the word lines WL and the select gate lines SGS and SGD. For example, tungsten (W) formed by chemical vapor deposition (CVD) has a tensile stress. Therefore, if the word lines WL and the select gate lines SGS and SGD have a shape of a rectangular plane having long sides in the X-direction and short sides in the Y-direction, for example, the semiconductor substrate 30 has a large amount of warp in the X-direction due to the influence of the remaining stress received from the word lines WL and the select gate lines SGS and SGD. In the present embodiment, a case where a stacked structure of titanium nitride (TiN) and tungsten (W) is employed as the interconnect layers 34 will be described below. TiN functions as a barrier layer for preventing reaction between W and Si or $SiO_2$, or as an adhesion layer for improving adhesiveness of W, when forming a film of W by the CVD, for example.

The memory pillars MP are formed that pass through the ten interconnect layers 34, so that the bottom faces of the memory pillars MP reach the p-type well 32. The memory pillar MP includes a block insulating film 36, a charge storage layer 37, a tunnel insulating film 38, a semiconductor layer 39, a core layer 40, and a cap layer 41.

More specifically, a hole corresponding to the memory pillar MP is formed to pass through the ten interconnect layers 34, so that the bottom face of the hole reaches the p-type well 32. The block insulating film 36, the charge storage layer 37, and the tunnel insulating film 38 are sequentially stacked on a side face of the hole. The semiconductor layer 39 is formed so that the side face of the semiconductor layer 39 is in contact with the tunnel insulating film 38 and the bottom face of the semiconductor layer 39 is in contact with the p-type well 32. The semiconductor layer 39 is an area where channels of the memory cell transistors MC and the select transistors ST1 and ST2 are formed. Therefore, the semiconductor layer 39 functions as a signal line coupling the current paths of the select transistor ST2, the memory cell transistors MC0 through MC7, and the select transistor ST1. The core layer 40 is provided in the semiconductor layer 39. The cap layer 41, having a side face contacting the tunnel insulating film 38, is formed on the semiconductor layer 39 and the core layer 40.

$SiO_2$, for example, is used for the block insulating film 36, the tunnel insulating film 38, and the core layer 40. SiN, for example, is used for the charge storage layer 37. Polysilicon, for example, is used for the semiconductor layer 39 and the cap layer 41.

The memory pillar MP and the eight interconnect layers 34 that function as the word lines WL0 to WL7 form the memory cell transistors MC0 to MC7, respectively. Likewise, the memory pillar MP and the two interconnect layers 34 that function as the select gate lines SGD and SGS, form the select transistors ST1 and ST2, respectively.

In the example shown in FIG. 3, one interconnect layer 34 functioning as the select gate line SGD and one interconnect layer 34 functioning as the select gate line SGS are provided, but a plurality of them may be provided.

A contact plug CP is formed on the cap layer 41. An interconnect layer (not shown), functioning as the bit line BL, is formed on the contact plug CP. For example, a metal material such as W or TiN is used for the contact plug CP.

A slit SLT, which has a bottom face reaching the $n^+$-type diffusion layer 33 and extends in the X-direction, is formed to separate each of the ten interconnect layers 34 in the Y-direction. The insulating layer 42 is formed on the side face of the slit SLT. A conductive layer 43, which has a side face contacting the insulating layer 42 and a bottom face contacting the $n^+$-type diffusion layer 33, is formed in the slit SLT. The conductive layer 43 functions as the source line contact LI. The conductive layer 43 has a line shape extending in the X-direction. An upper face of the conductive layer 43 is coupled to an interconnect layer (not shown) that functions as the source line SL.

$SiO_2$, for example, is used for the insulating layer 42. For example, a semiconductor material such as polysilicon, a metal material such as W, or a stack of these materials is used for the conductive layer 43.

Furthermore, a slit SHE extending in the X-direction is formed to separate the uppermost interconnect layer 34 functioning as the select gate line SGD in the Y-direction. The slit SHE is filled with the insulating layer 44. For example, $SiO_2$ is used for the insulating layer 44.

1.1.4. Planar Configuration of Passivation Film

Next, a planar configuration of the passivation film will be described with reference to FIG. 4. The passivation film PV is an insulating layer formed to protect various elements formed on the semiconductor substrate 30. For example, an insulating material having low permeability is used for the passivation film PV. A case where SiN having a compressive stress is used for the passivation film PV will be described below.

Figure 4:
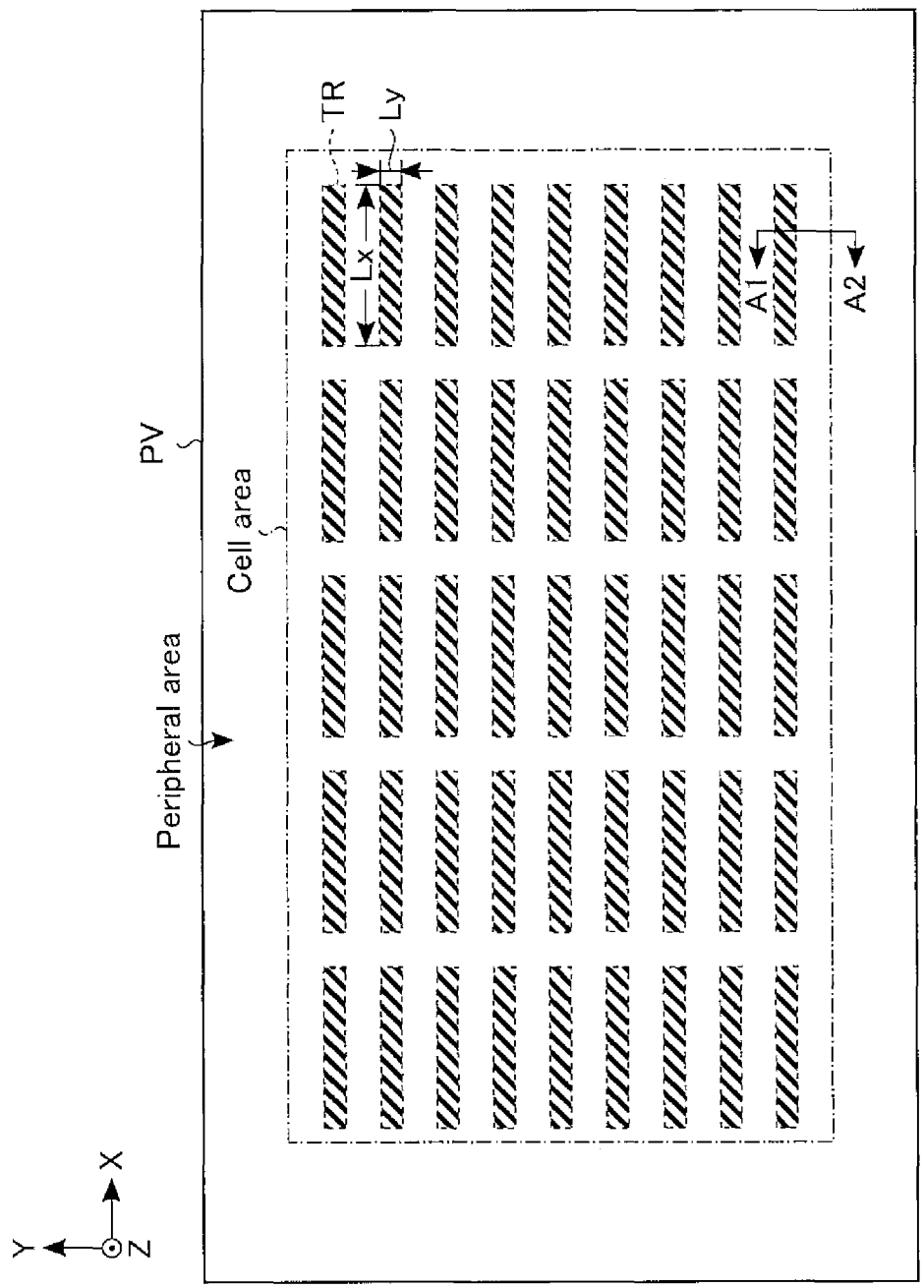
FIG. 4 is a plan view of a cover insulation film included in the semiconductor memory device according to the first embodiment.

As shown in FIG. 4, the passivation film PV includes a plurality of protrusions TR in an area (hereinafter referred to as "cell area") below which the memory cell array 18 is formed. The protrusions TR have a lower face protruding downward. In the example shown in FIG. 4, the protrusions TR are provided in a matrix of nine rows and five columns. When the length of the protrusion TR in the X-direction is defined as Lx, and the length of the protrusion TR in the Y-direction is defined as Ly, the relationship Lx>Ly is satisfied. Namely, the protrusion TR is a rectangle having long sides in the X-direction and short sides in the Y-direction on the XY-plane.

In the present embodiment, the protrusion TR, like the interconnect layers 34, has a rectangular shape with long sides in the X-direction and short sides in the Y-direction on the XY-plane, so that the amount of warp in the semiconductor substrate 30 in the X-direction due to the tensile stress of the interconnect layers 34 of the memory cell array 18 is reduced.

In the example shown in FIG. 4, the protrusions TR are provided in the cell area; however, the area where the protrusions TR are provided is not limited to the cell area. The protrusions TR may be provided in a peripheral area as well.

1.1.5. Cross-Sectional Configuration of Passivation Film

Next, a cross-sectional configuration of the passivation film PV will be described with reference to FIG. 5. FIG. 5 is a cross-sectional view taken along line A1-A2 in FIG. 4. To simplify the illustration, the example shown in FIG. 5 illustrates uppermost contact plugs V2 and layers thereabove, omitting the memory cell array 18 described with reference to FIG. 3.

As shown in FIG. 5, the contact plugs V2 passing through an insulating layer 50 is formed. The memory cell array 18 is formed below the insulating layer 50 in the cell area. An insulating layer 51 is formed on the insulating layer 50, and uppermost interconnect layers M2 are provided on the contact plugs V2.

For example, $SiO_2$ is used for the insulating layers 50 and 51. The contact plugs V2 and the interconnect layers M2 are made of a conductive material. For example, a metal material such as aluminum (Al) is used for the contact plugs V2 and the interconnect layers M2.

A slit extending in the X-direction is formed on an upper face of the insulating layer 51 in the cell area, and the slit is filled with an insulating layer 52 formed on the insulating layer 51. The insulating layer 52 functions as the passivation film PV. The insulating layer 52 filling the slit functions as the protrusion TR. In the example shown in FIG. 5, the height position of the bottom face of the protrusion TR is lower than the height position of the upper face of the interconnect layer M2 in the Z-direction; however, the height position is not limited thereto. The lengths of the protrusion TR in the X-direction and the Y-direction, the height of the protrusion TR in the Z-direction, the distance between adjacent protrusions TR, and the like are set according to the amount of warp in the semiconductor substrate 30, the film properties (film stress) of the insulating layer 52, and the like.

For example, CVD-SiN is used for the insulating layer 52. SiN can have varied film density and film stress by adjusting the film formation conditions (film formation temperature, film formation pressure, RF power, etc.). SiN can also varied film stress from tensile stress to compressive stress through heat treatment or treatment such as injection after film formation. For example, using SiN with a relatively high compressive stress for the insulating layer 52 can effectively reduce the amount of warp in the semiconductor substrate 30 in the X-direction. The material of the passivation film PV is not limited to SiN. Any material may be used as long as it is an insulating material having low permeability and a compressive stress.

A resin 53 is formed on the insulating layer 52. The resin 53 also functions as a protective layer. For example, polyimide is used for the resin 53.

A hole which passes through the resin 53, insulating layer 52, and insulating layer 51 and has the bottom face reaching the interconnect layer M2 is formed in the peripheral area. The area where the interconnect layer M2 is exposed functions as an electrode pad PD.

1.2. Method of Manufacturing Semiconductor Memory Device

Next, a method of manufacturing the semiconductor memory device will be described with reference to FIGS. 6 to 8. The examples shown in FIGS. 6 to 8 illustrate mainly the process for producing the protrusion TR.

First, the insulating layer 50 is formed, as shown in FIG. 6. Next, holes corresponding to the contact plugs V2 are formed. A stacking structure of Al and TiN, for example, is formed to fill the holes. Next, the stacking structure of Al and TiN on the insulating layer 50 is processed to form the interconnect layers M2. Next, the insulating layer 51 is formed. The contact plugs V2 and the interconnect layers M2 may be formed separately.

Figure 7:
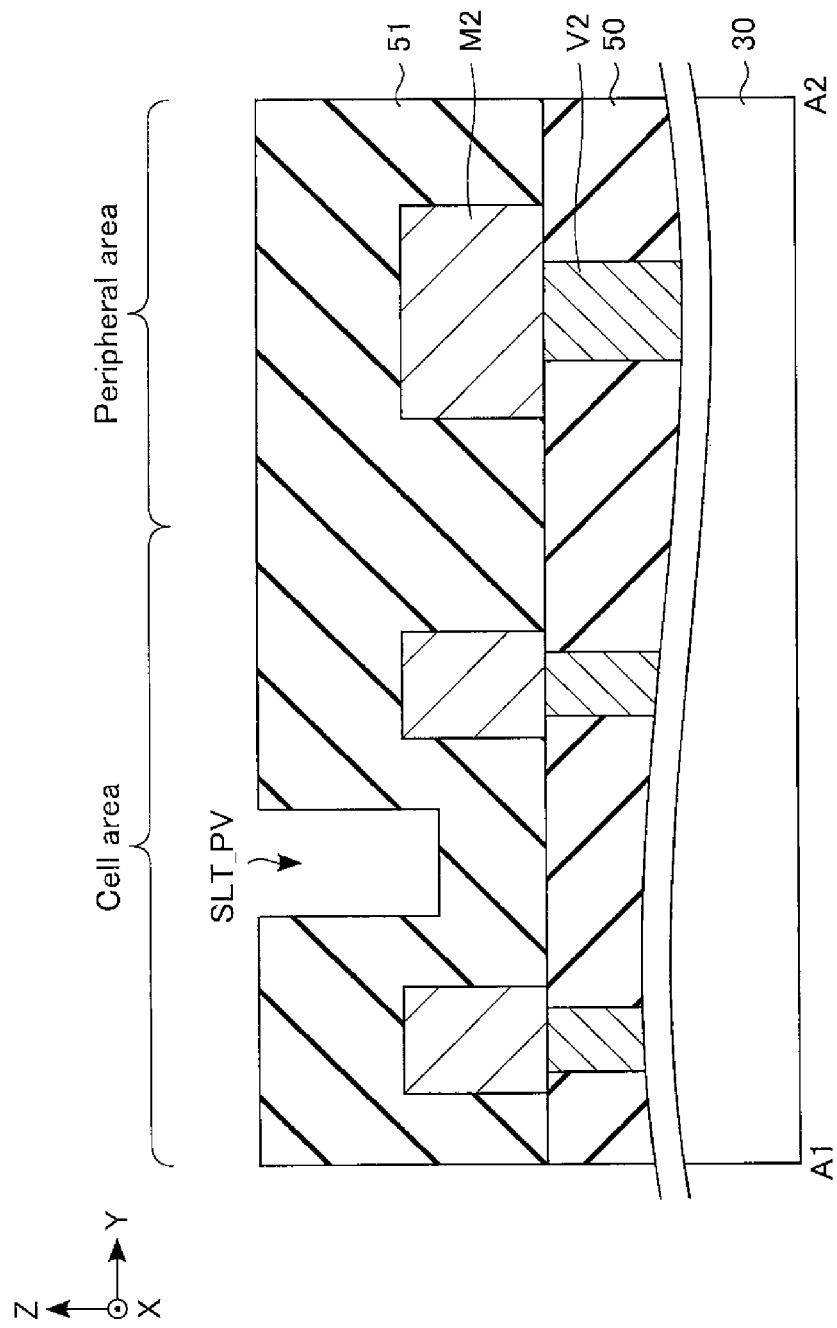

As shown in FIG. 7, the insulating layer 51 is processed to form a slit SLT PV corresponding to the protrusion TR in the cell area.

Figure 8:
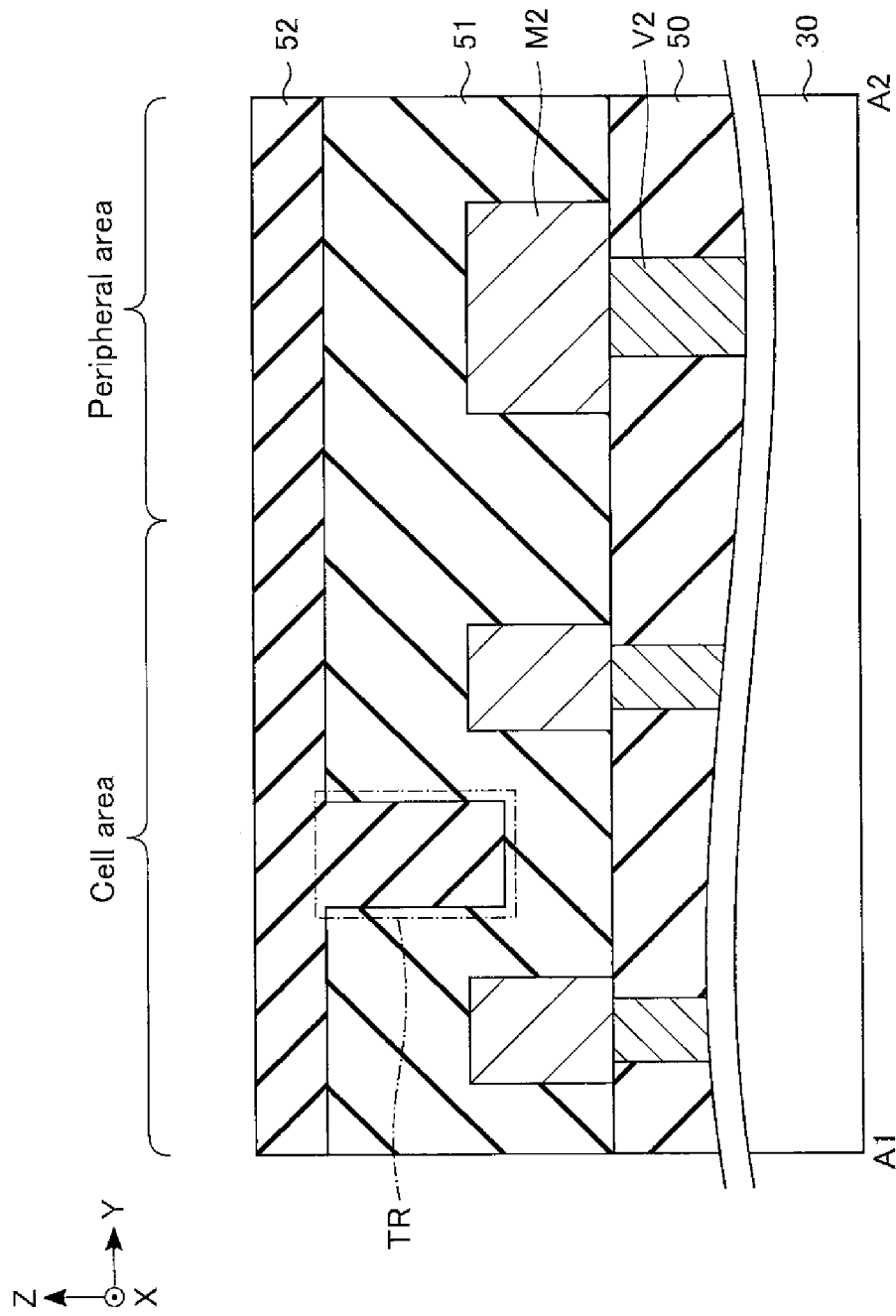

As shown in FIG. 8, the insulating layer 52 is formed. At this time, the slit SLT PV is filled with the insulating layer 52, thereby forming the protrusion TR. Thereafter, the insulating layer 52 is processed to form a hole corresponding to the electrode pad PD, and then a resin 53 is formed, as shown in FIG. 5. The resin 53 is processed to expose the interconnect layer M2 functioning as the electrode pad PD. A pattern of the electrode pad PD may be formed on the resin 53 by using photosensitive polyimide for the resin 53.

1.3. Advantageous Effects of Present Embodiment

The configuration according to the present embodiment can provide a semiconductor memory device with improved yields. The advantageous effects will be detailed below.

Focusing on the relationship between the film stress of the word lines WL and the amount of warp in the semiconductor substrate 30, when the word lines WL have a rectangular shape with long sides in the X-direction and short sides in the Y-direction on the XY-plane, for example, the amount of warp in the semiconductor substrate 30 due to the remaining stress received from the word lines WL is large in the X-direction and small in the Y-direction. This tendency becomes even more significant if the number of word lines WL stacked increases along with high integration of the three-dimensional stacked NAND flash memory. If the difference between the amount of warp in the X-direction and the amount of warp in the Y-direction of the semiconductor substrate 30 is large, it is difficult to align the electrode pad PD in an assembly step, for example, easily causing poor coupling due to the misalignment. Also, a crack in the insulating layer, etc., may easily form due to the warp in the semiconductor substrate 30. It is also difficult to deliver a chip after dicing. As such, production yields decrease.

In contrast, with the configuration according to the present embodiment, the passivation film PV (insulating layer 52) having the protrusions TR can be formed. Providing the protrusions TR makes the film stress of the passivation film PV in the X-direction differ from the film stress of the passivation film PV in the Y-direction. The metal used for the word lines WL has a tensile stress. Therefore, using the insulating layer 52 having a compressive stress can reduce the amount of warp in the semiconductor substrate 30 in the X-direction, and can reduce the difference between the amount of warp in the X-direction and the amount of warp in the Y-direction. As a result, a decrease of the production yields can be suppressed.

Furthermore, with the configuration according to the present embodiment, providing the protrusions TR having a rectangular shape with long sides in the X-direction and short sides in the Y-direction on the XY-plane, like the word lines WL, can inhibit the amount of warp in the Y-direction due to the protrusions TR from increasing.

In the present embodiment, the case where the protrusions TR are formed on the lower face of the insulating layer 52 is described; however, the protrusion TR may be formed on the upper face of the insulating layer 52.

2. Second Embodiment

Next, a second embodiment will be described. In the second embodiment, three examples will be described for the layout of the protrusions TR.

2.1. First Example

First, a first example will be described with reference to FIG. 9.

As shown in FIG. 9, the protrusions TR extend in the X-direction from one end of the cell area to the other end of the cell area. In the example shown in FIG. 9, nine protrusions TR are arranged in the Y-direction.

2.2. Second Example

Next, a second example will be described with reference to FIG. 10.

As shown in FIG. 10, a plurality of protrusions TR extending in direction A different from directions X and Y, and a plurality of protrusions TR extending in direction B different from direction A are arranged in a mesh form on the XY-plane.

2.3. Third Example

Next, a third example will be described with reference to FIG. 11.

Figure 11:
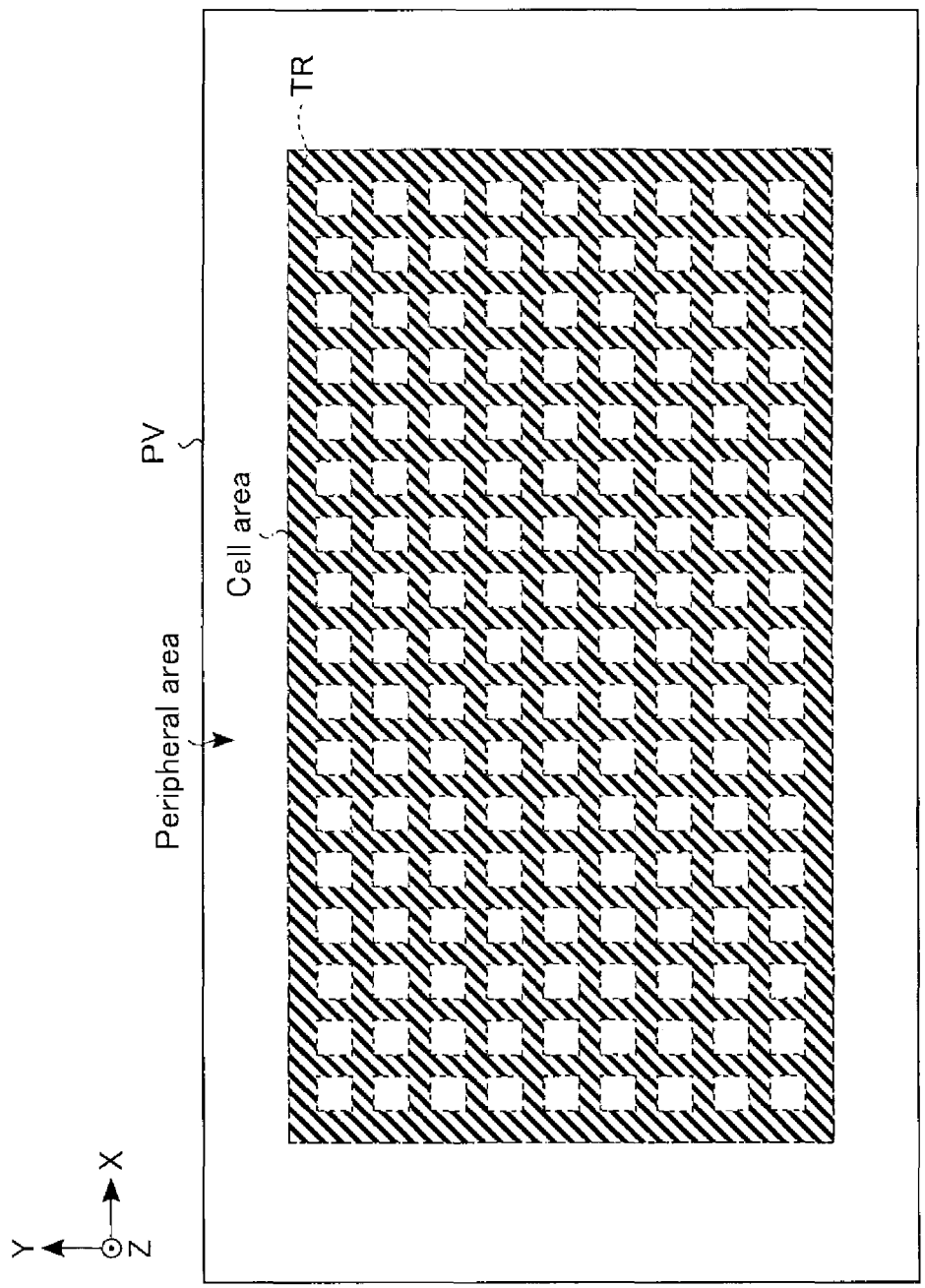
FIG. 11 is a plan view of a cover insulation film included in a semiconductor memory device according to a third example of the second embodiment.

As shown in FIG. 11, a plurality of protrusions TR extending in the X-direction, and a plurality of protrusions TR extending in the Y-direction are arranged in a lattice form on the XY-plane.

2.4. Advantageous Effects of Present Embodiment

The configuration according to the present embodiment can be applied to the first embodiment.

3. Third Embodiment

Next, a third embodiment will be described. In the third embodiment, a configuration of the passivation film PV which differs from that of the first embodiment will be described. Hereinafter, mainly the matters which differ from the first embodiment will be described.

3.1. Cross-sectional Configuration of Passivation Film

First, a cross-sectional configuration of the passivation film PV will be described with reference to FIG. 12. The example shown in FIG. 12, like the one shown in FIG. 5 of the first embodiment, illustrates layer of the uppermost contact plugs V2 and layers thereabove, to simplify the illustration.

In the present embodiment, an insulating layer 54 is provided between the insulating layer 51 and the insulating layer 52, as shown in FIG. 12. Also, the protrusion TR is provided so that protrusion TR passes through the insulating layer 54 and the bottom face of protrusion TR reaches the inside of the insulating layer 51. Other than the above, the configuration is the same as that shown in FIG. 5 of the first embodiment.

For example, SiN having the same film stress as that of the insulating layer 52, or SiN having a film stress different from that of the insulating layer 52 may be used for the insulating layer 54. An insulating material not having the properties (e.g., high permeability) for the passivation film PV, for example, may also be used for the insulating layer 54. In this case, an insulating material having a compressive stress, for example, is selected to reduce the amount of warp in the semiconductor substrate 30.

3.2. Method of Manufacturing Semiconductor Memory Device

Next, a method of manufacturing the semiconductor memory device will be described with reference to FIGS. 13 to 15. The examples shown in FIGS. 13 to 15 illustrate mainly the process for producing the protrusion TR.

Figure 13:
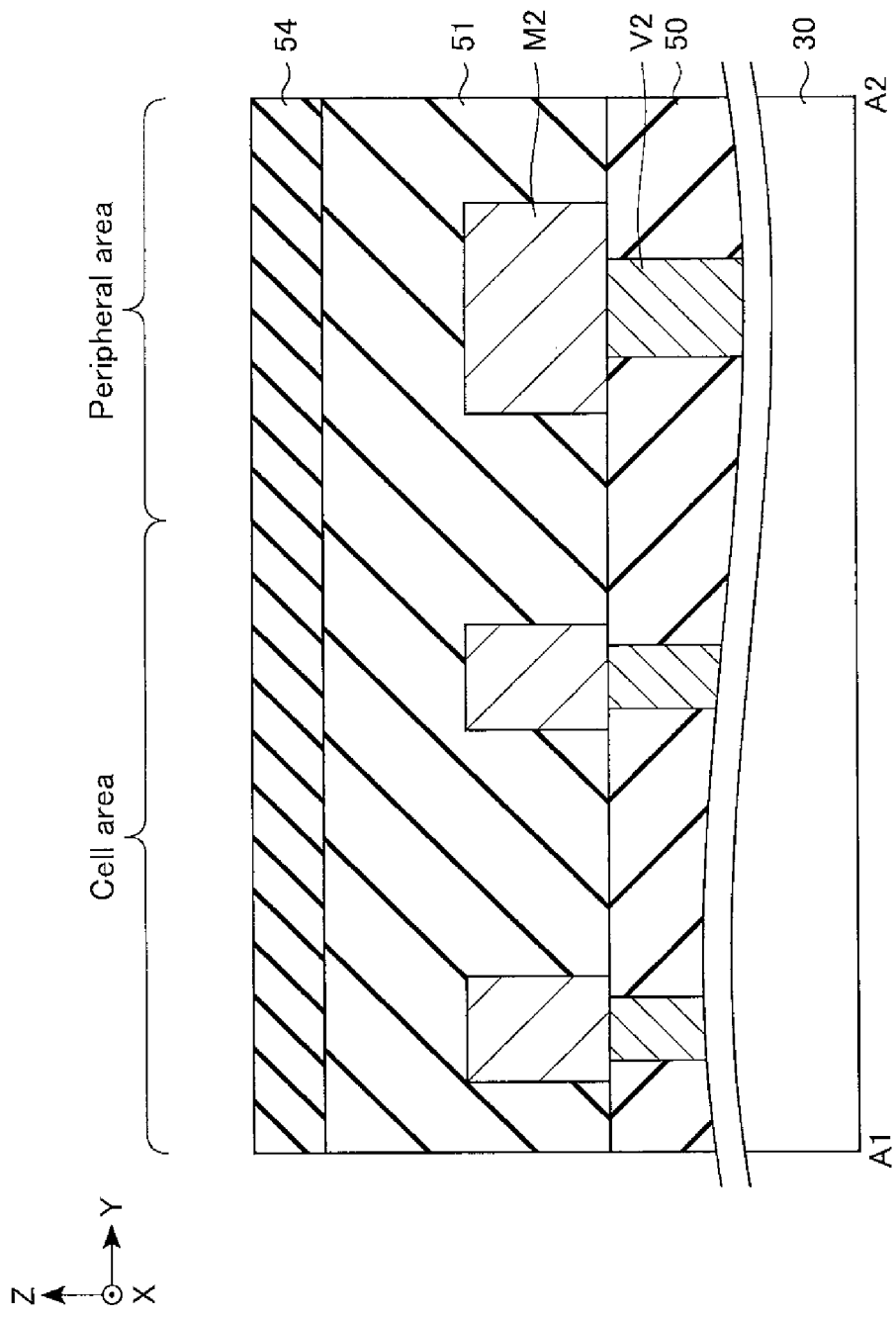
FIGS. 13 and 14 are diagrams illustrating a process for manufacturing the semiconductor memory device according to the third embodiment.

As shown in FIG. 13, after the insulating layer 51 is formed as in the example shown in FIG. 6 of the first embodiment, the insulating layer 54 is formed on the insulating layer 51.

Figure 14:
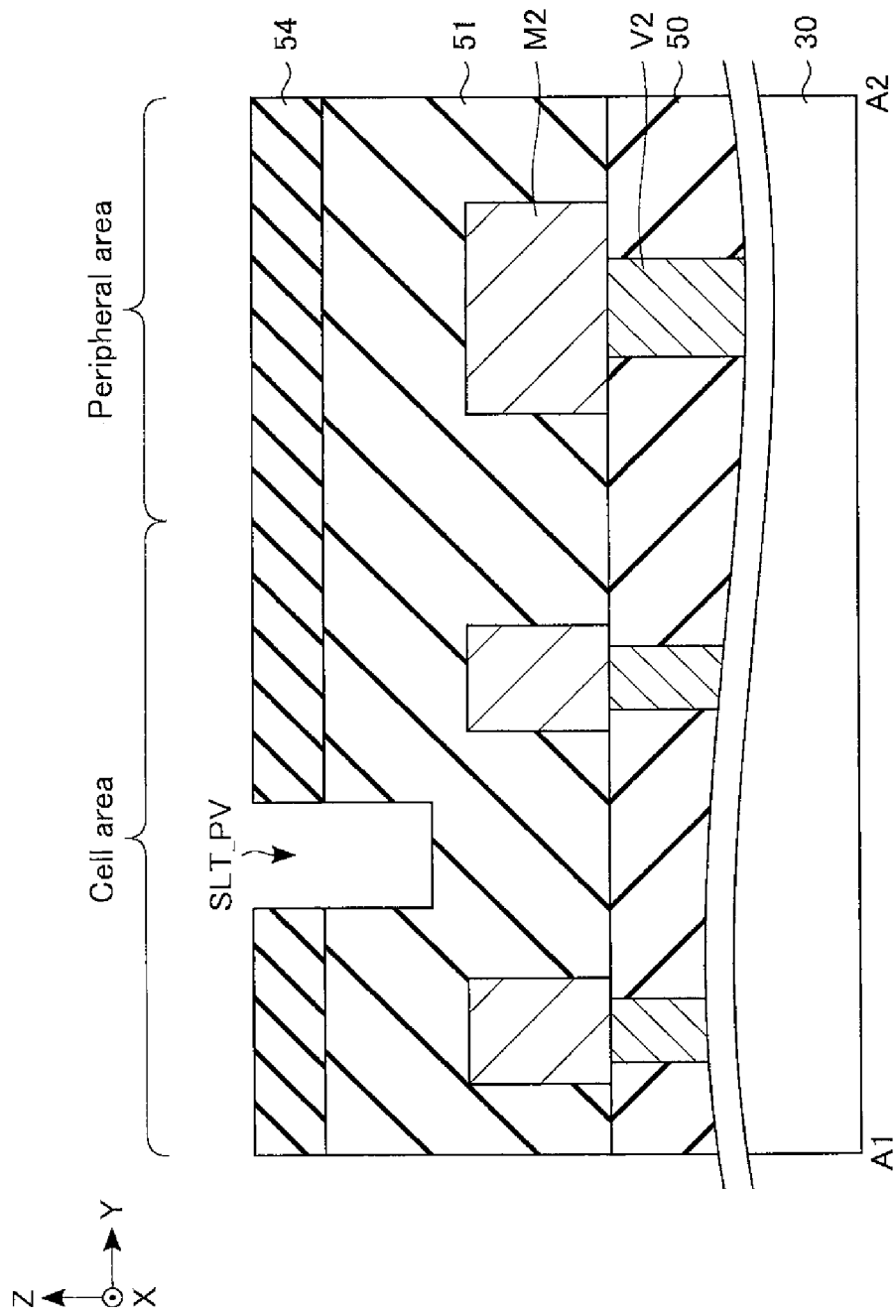

As shown in FIG. 14, the insulating layers 54 and 51 are processed to form the slit SLT PV corresponding to the protrusion TR. As a result, the insulating layer 54 has a lattice shape with long sides in the X-direction and short sides in the Y-direction in the cell area. Therefore, the film stress in the X-direction and the film stress in the Y-direction of the insulating layer 54 differ from each other.

Figure 15:
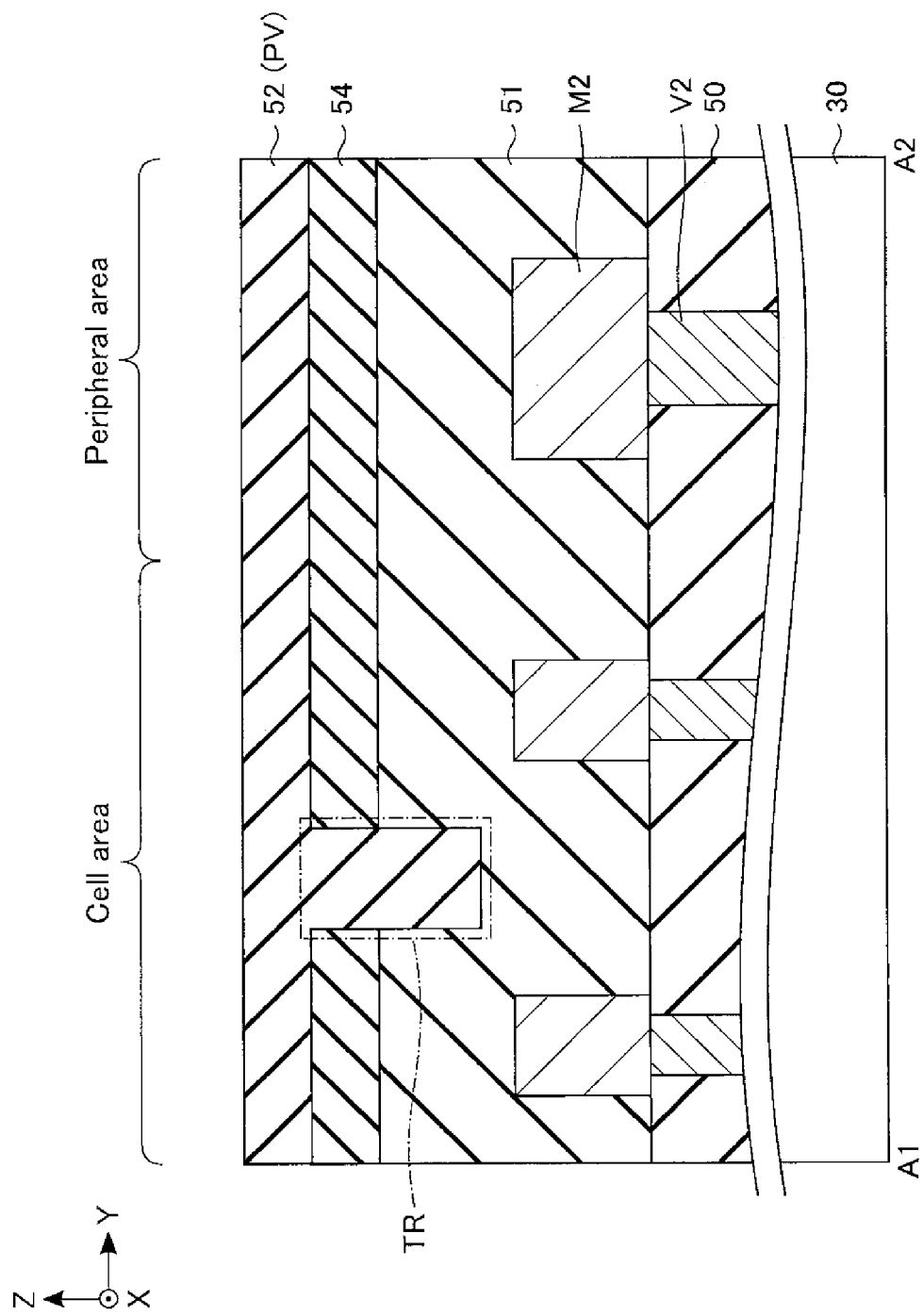
FIG. 15 is a diagram illustrating a process for manufacturing the semiconductor memory device according to the third embodiment.

As shown in FIG. 15, the insulating layer 52 is formed. Thereby, the slit SLT PV is filled with the insulating layer 52, forming the protrusion TR. Thereafter, the hole corresponding to the electrode pad PD is formed, and then the resin 53 is formed, as shown in FIG. 12.

3.3. Advantageous Effects of Present Embodiment

The configuration of the present embodiment achieves advantageous effects similar to those of the first embodiment.

Furthermore, according to the configuration of the present embodiment, the insulating layer 54 having a compressive stress has a lattice shape with long sides in the X-direction and short sides in the Y-direction in the cell area. Therefore, the film stress in the X-direction and the film stress in the Y-direction of the insulating layer 54 differ from each other, making it possible to effectively reduce the amount of warp in the semiconductor substrate 30 in the X-direction.

Furthermore, with the configuration of the present embodiment, forming the insulating layer 54 can increase the distance in the Z-direction from the upper face of the interconnect layer M2 to the bottom face of the insulating layer 52 (protrusion TR). As a result, the height position of the bottom portion of the protrusion TR can be higher than the height position of the upper face of the interconnect layer M2, making it possible to design the layout of the protrusions TR irrespective of the layout of the interconnect layers M2.

The present embodiment and the second embodiment may be combined.

4. Fourth Embodiment

Next, the fourth embodiment will be described. In the fourth embodiment, a configuration of the passivation film PV which differs from those of the first and third embodiments will be described. Hereinafter, mainly the matters which differ from the first to third embodiments will be described.

4.1. Cross-sectional Configuration of Passivation Film

First, a cross-sectional configuration of the passivation film PV will be described with reference to FIG. 16. The example shown in FIG. 16, like the one shown in FIG. 5 of the first embodiment, illustrates the uppermost contact plugs V2 and layers thereabove, to simplify the illustration.

Figure 16:
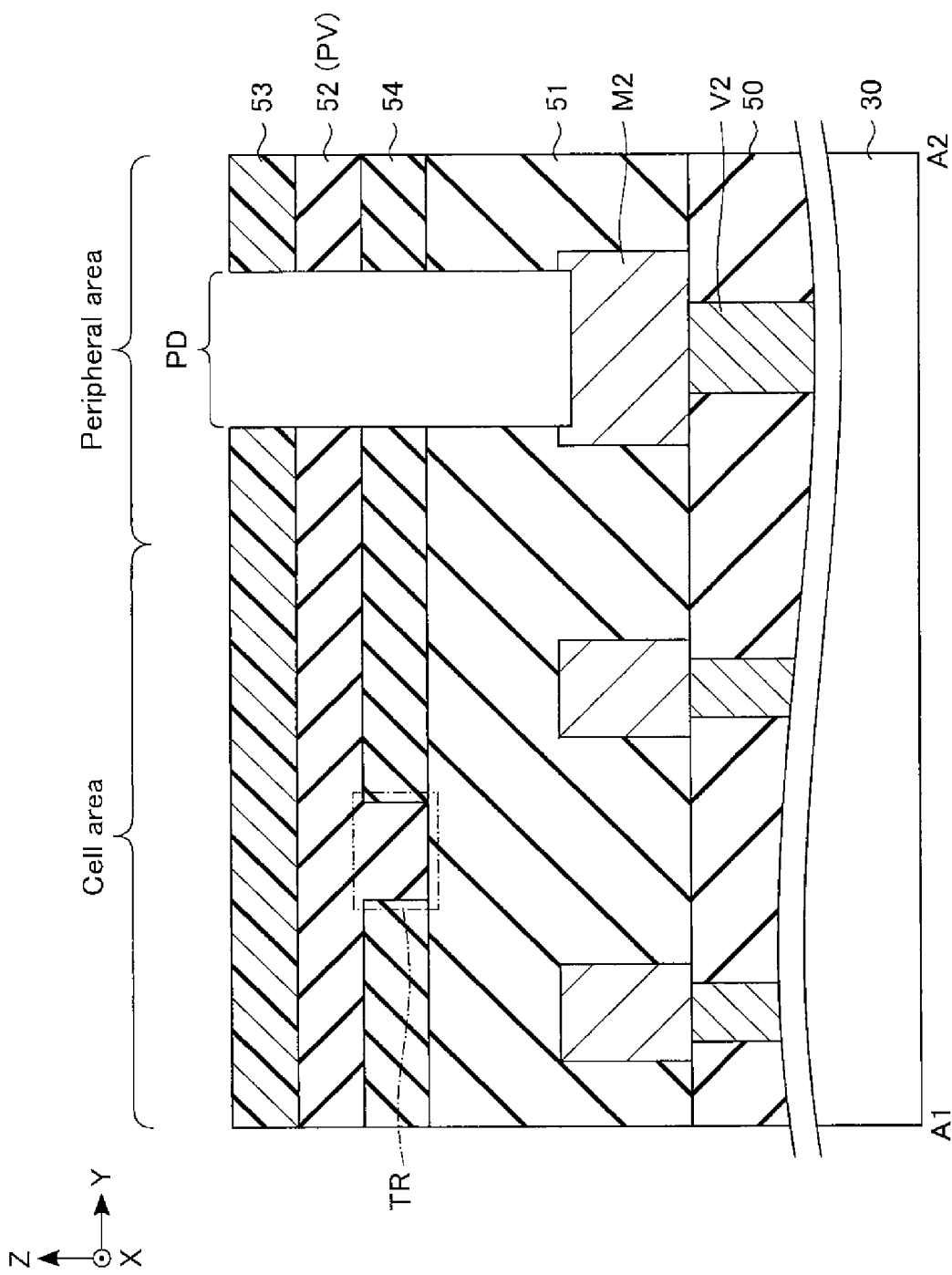
FIG. 16 is a cross-sectional view of a semiconductor memory device according to a fourth embodiment.

In the present embodiment, the protrusion TR is provided so that it passes through the insulating layer 54 and the bottom face of the protrusion TR is in contact with the surface of the insulating layer 51, as shown in FIG. 16. Other than this, the configuration is the same as that shown in FIG. 12 of the third embodiment.

4.2. Advantageous Effects of Present Embodiment

The configuration of the present embodiment achieves advantageous effects similar to those of the first and third embodiments. The present embodiment and the second embodiment may be combined.

5. Fifth Embodiment

Next, the fifth embodiment will be described. In the fifth embodiment, a configuration of the passivation film PV which differs from those of the first, third, and fourth embodiments will be described. Hereinafter, mainly the matters which differ from the first to fourth embodiments will be described.

5.1. Cross-sectional Configuration of Passivation Film

First, a cross-sectional configuration of the passivation film PV will be described with reference to FIG. 17. The example shown in FIG. 17, like the one shown in FIG. 5 of the first embodiment, illustrates the uppermost contact plugs V2 and layers thereabove, to simplify the illustration.

Figure 17:
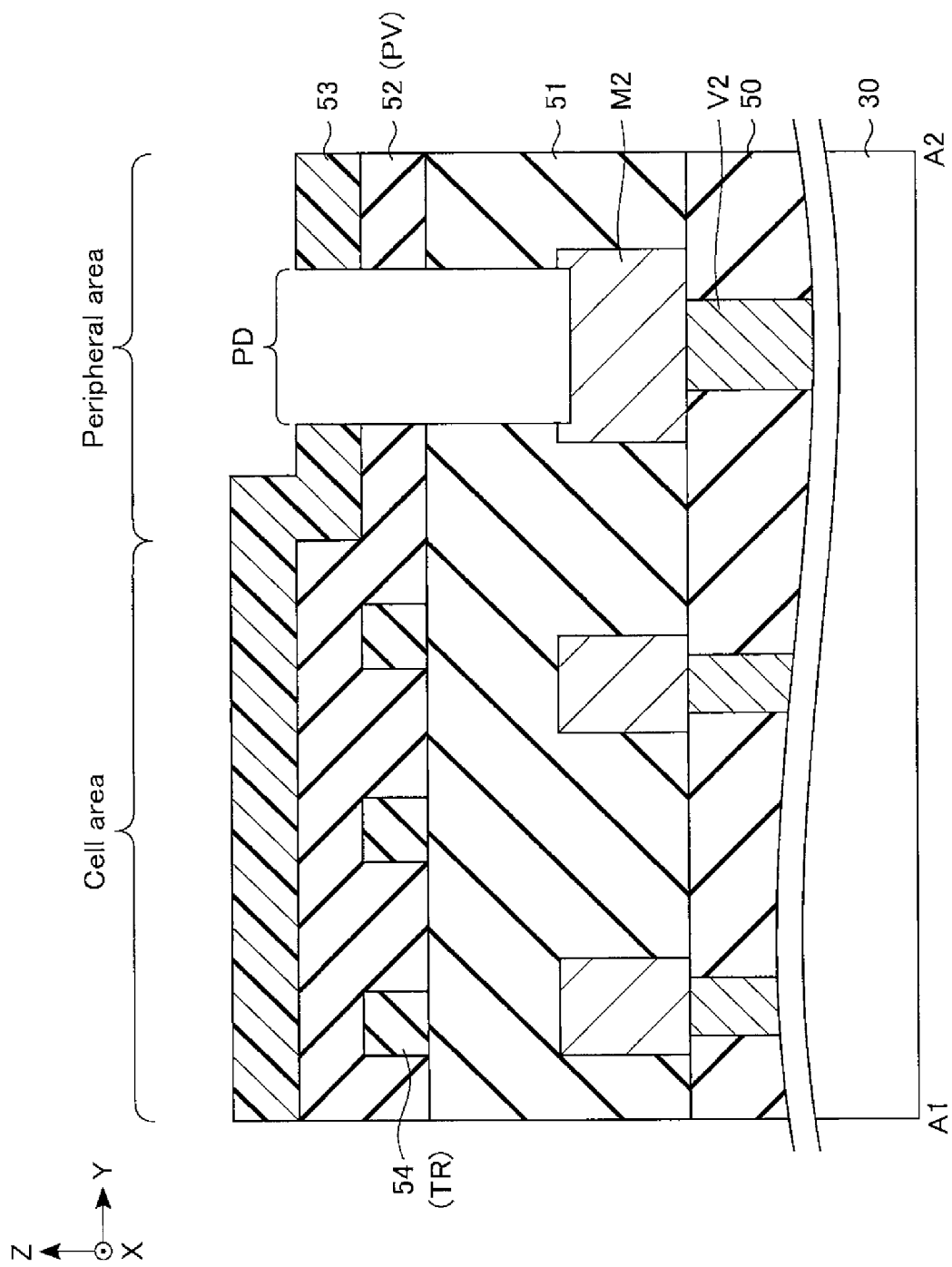
FIG. 17 is a cross-sectional view of a semiconductor memory device according to a fifth embodiment.

In the present embodiment, the protrusions TR are formed using the insulating layer 54, as shown in FIG. 17. In the example shown in FIG. 17, a plurality of protrusions TR extending in the X-direction are formed using the insulating layer 54. Other than these, the configuration is the same as that shown in FIG. 16 of the fourth embodiment.

5.2. Method of Manufacturing Semiconductor Memory Device

Next, a method of manufacturing the semiconductor memory device will be described with reference to FIGS. 18 and 19. The examples shown in FIGS. 18 and 19 illustrate mainly the process for producing the protrusions TR.

Figure 18:
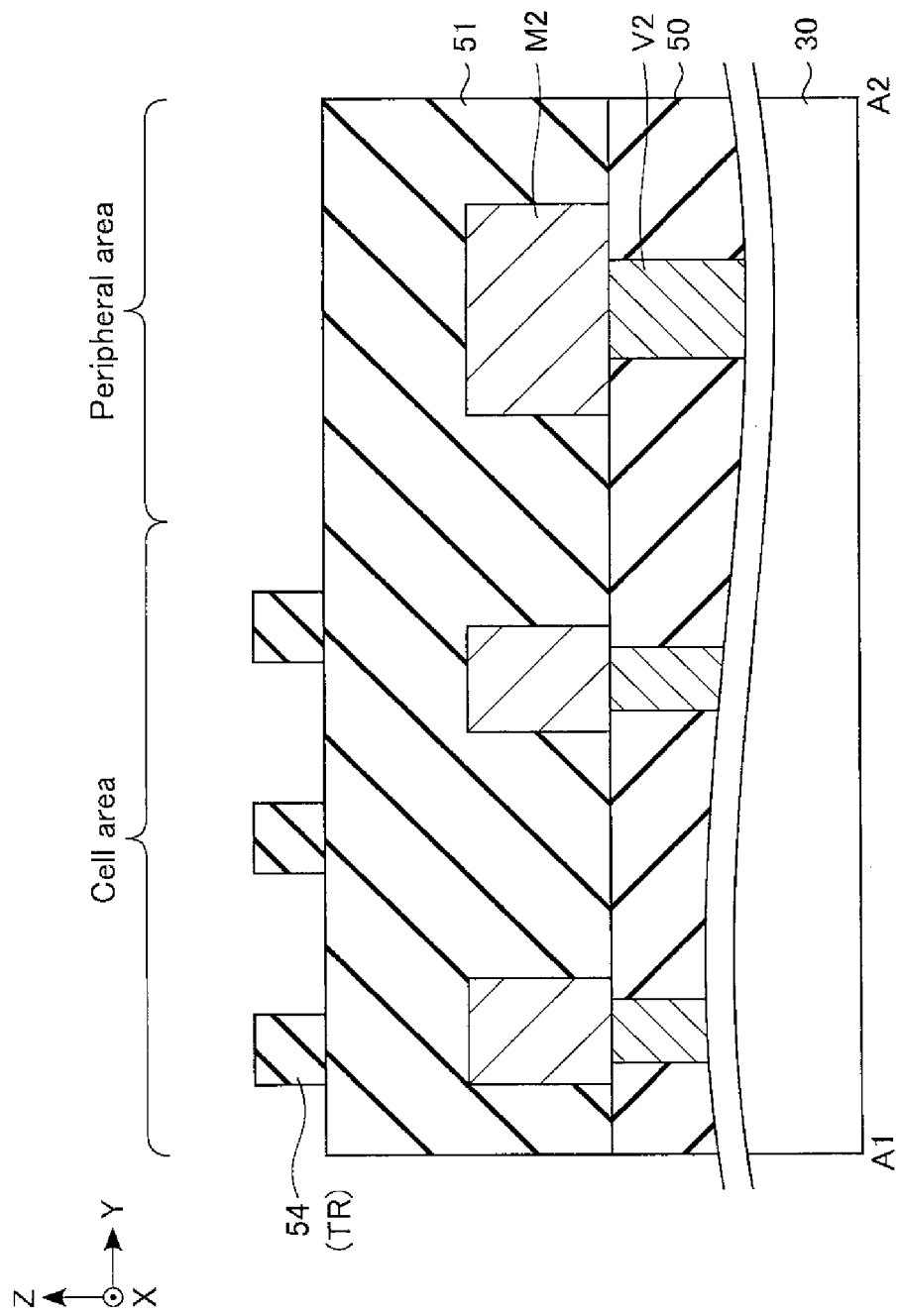

As shown in FIG. 18, after the insulating layer 51 is formed as in the example shown in FIG. 6 of the first embodiment, the insulating layer 54 is formed on the insulating layer 51. Next, the insulating layer 54 is processed to form the protrusions TR. Therefore, the insulating layer 54 is not formed in the peripheral area.

As shown in FIG. 19, the insulating layer 52 is formed. Thereafter, the hole corresponding to the electrode pad PD is formed, and then the resin 53 is formed, as shown in FIG. 17.

5.3. Advantageous Effects of Present Embodiment

The configuration of the present embodiment achieves advantageous effects similar to those of the first to fourth embodiments.

6. Sixth Embodiment

Next, a sixth embodiment will be described. In the sixth embodiment, a configuration of the semiconductor memory device 1 which differs from those of the first to fifth embodiments will be described.

6.1. Configuration of Semiconductor Memory Device

Figure 20:
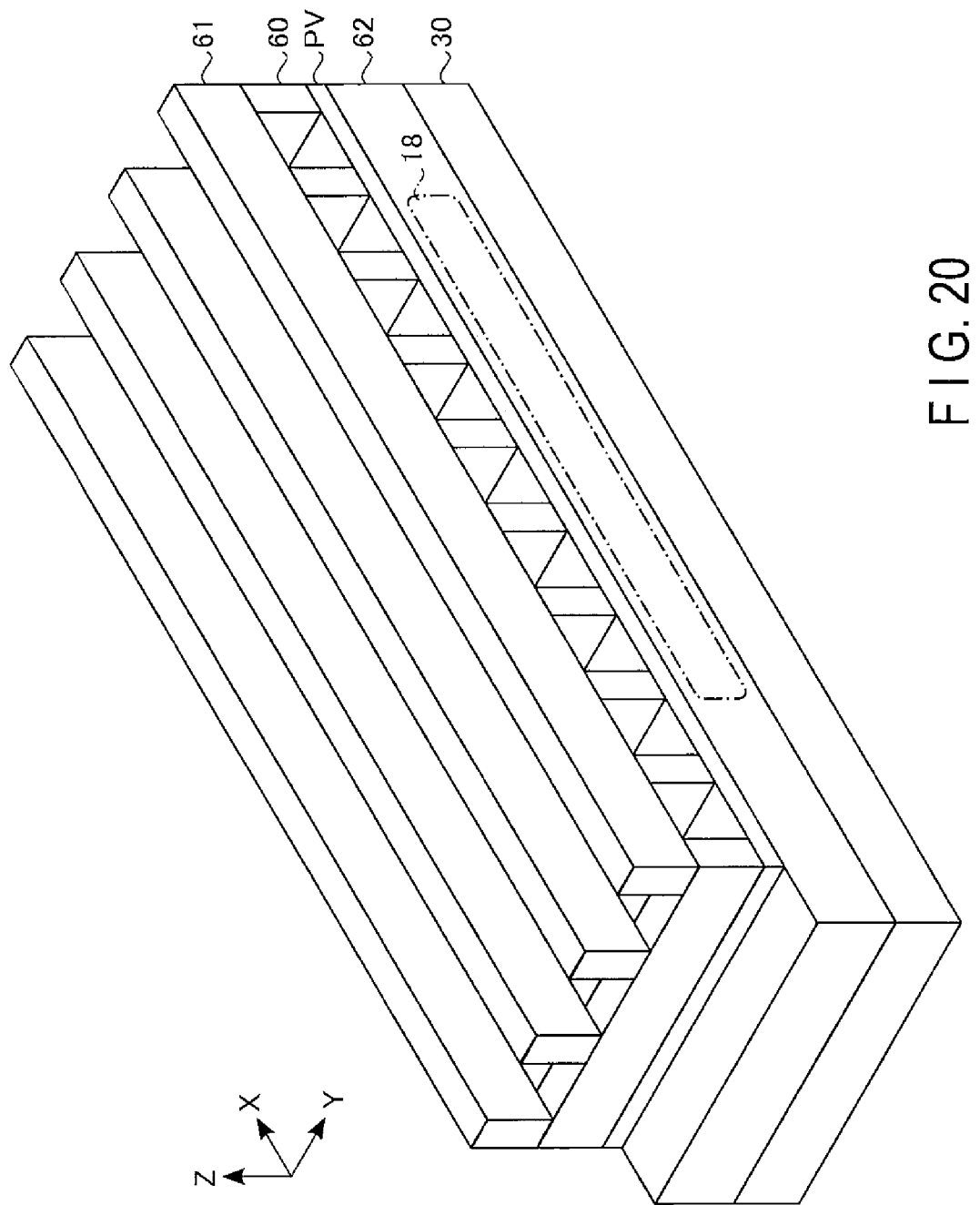
FIG. 20 is a perspective view of a semiconductor memory device according to a sixth embodiment.

First, a configuration of the semiconductor memory device 1 will be described with reference to FIG. 20. FIG. 20 is a perspective view of the semiconductor memory device 1. In the example shown in FIG. 20, some of the insulating layers and the resin 53 are omitted.

As shown in FIG. 20, an insulating layer 62 is formed on the semiconductor substrate 30. The insulating layer 62 represents the entire insulator formed on the semiconductor substrate 30. For example, the insulating layer 62 includes the insulating layer 51, etc., described in the first embodiment. For example, the memory cell array 18 is provided in the insulating layer 62. The passivation film PV is formed on the insulating layer 62, and is removed from the area where the electrode pad PD is formed.

A plurality of patterns of insulating layers 60 each extending in the Y-direction are arranged side by side in the X-direction on the passivation film PV. Also, a plurality of patterns of insulating layers 61 each extending in the X-direction are arranged side by side in the Y-direction on the insulating layers 60.

The insulating layers 60 and 61 are formed to reduce the amount of warp in the semiconductor substrate 30. The insulating layers 60 extending in the Y-direction, and the insulating layers 61 extending in the X-direction, are stacked to thereby control the amount of warp in the semiconductor substrate 30 in the X-direction and the amount of warp in the semiconductor substrate 30 in the Y-direction. For example, the amount of warp in the semiconductor substrate 30 in the X-direction and the amount of warp in the semiconductor substrate 30 in the Y-direction are reduced by adjusting the film properties (film stress) of the insulating layers 60 and 61, the height of the insulating layers 60 and 61 in the Z-direction, the width of the patterns, the interval between the patterns, and the like.

In the example shown in FIG. 20, the insulating layers 61 are formed on the insulating layers 60; however, the insulating layers 60 may be formed on the insulating layers 61.

6.2. Planar Configuration of Semiconductor Memory Device

Next, a planar configuration of the semiconductor memory device 1 will be described with reference to FIG. 21. FIG. 21 shows an example of the layout of the insulating layers 60 and 61 of the semiconductor memory device 1.

As shown in FIG. 21, the insulating layers 60 extending in the Y-direction and the insulating layers 61 extending in the X-direction are stacked in the cell area and the peripheral area excluding the area where the electrode pads PD are formed (hereinafter referred to as "PD area"). In the example shown in FIG. 21, the insulating layers 60 and 61 are formed in the area excluding the PD area; however, the insulating layers 60 and 61 need not be formed in the peripheral area. For example, the insulating layers 60 and 61 in the peripheral area may be removed when a larger film stress is generated in the cell area than in the peripheral area and the film stress in the cell area dominantly affects the warp in the semiconductor substrate 30.

6.3. Cross-sectional Configuration of Semiconductor Memory Device

Figure 22:
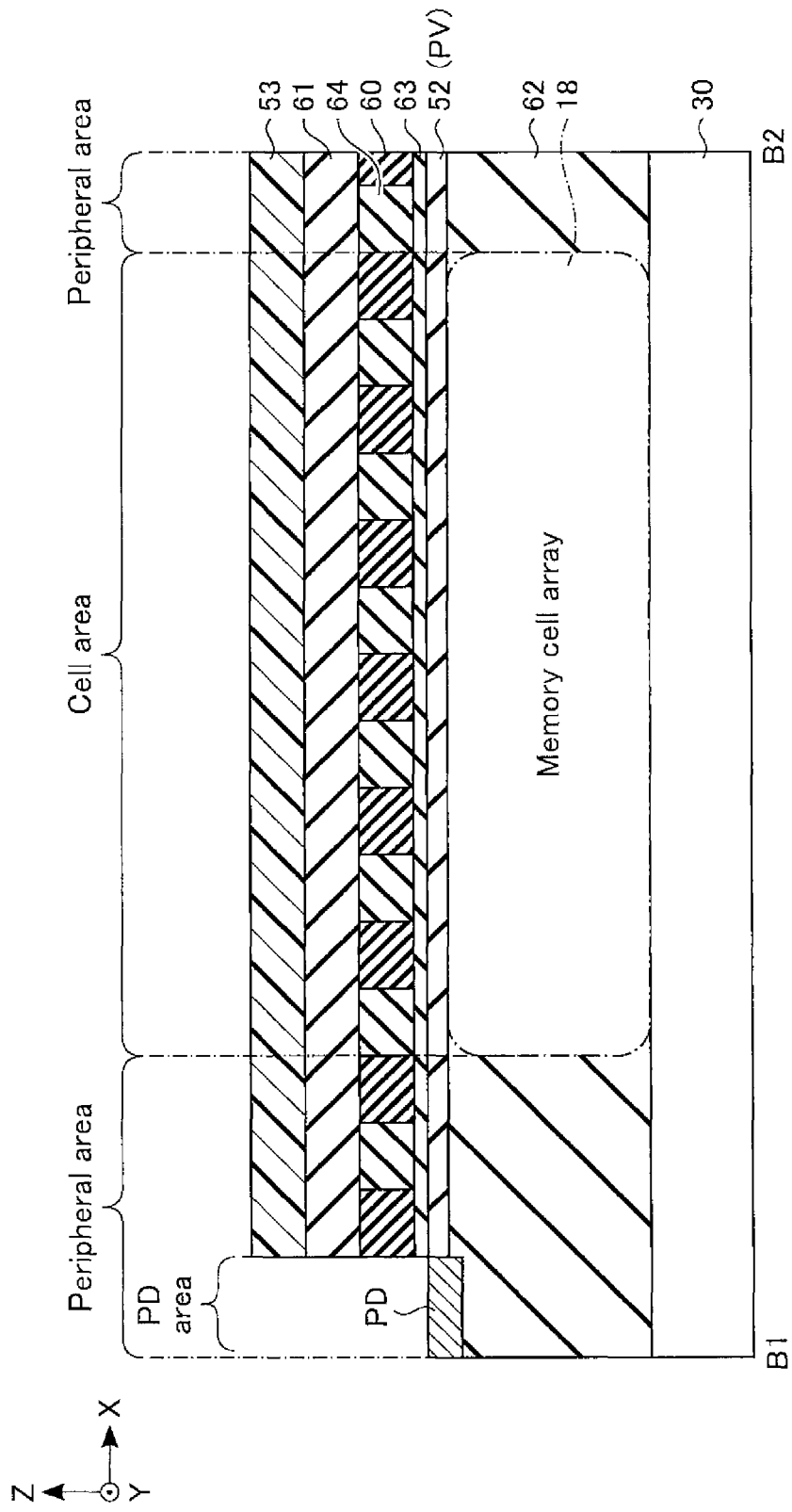
FIG. 22 is a cross-sectional view taken along line B1-B2 in FIG. 21.
Figure 23:
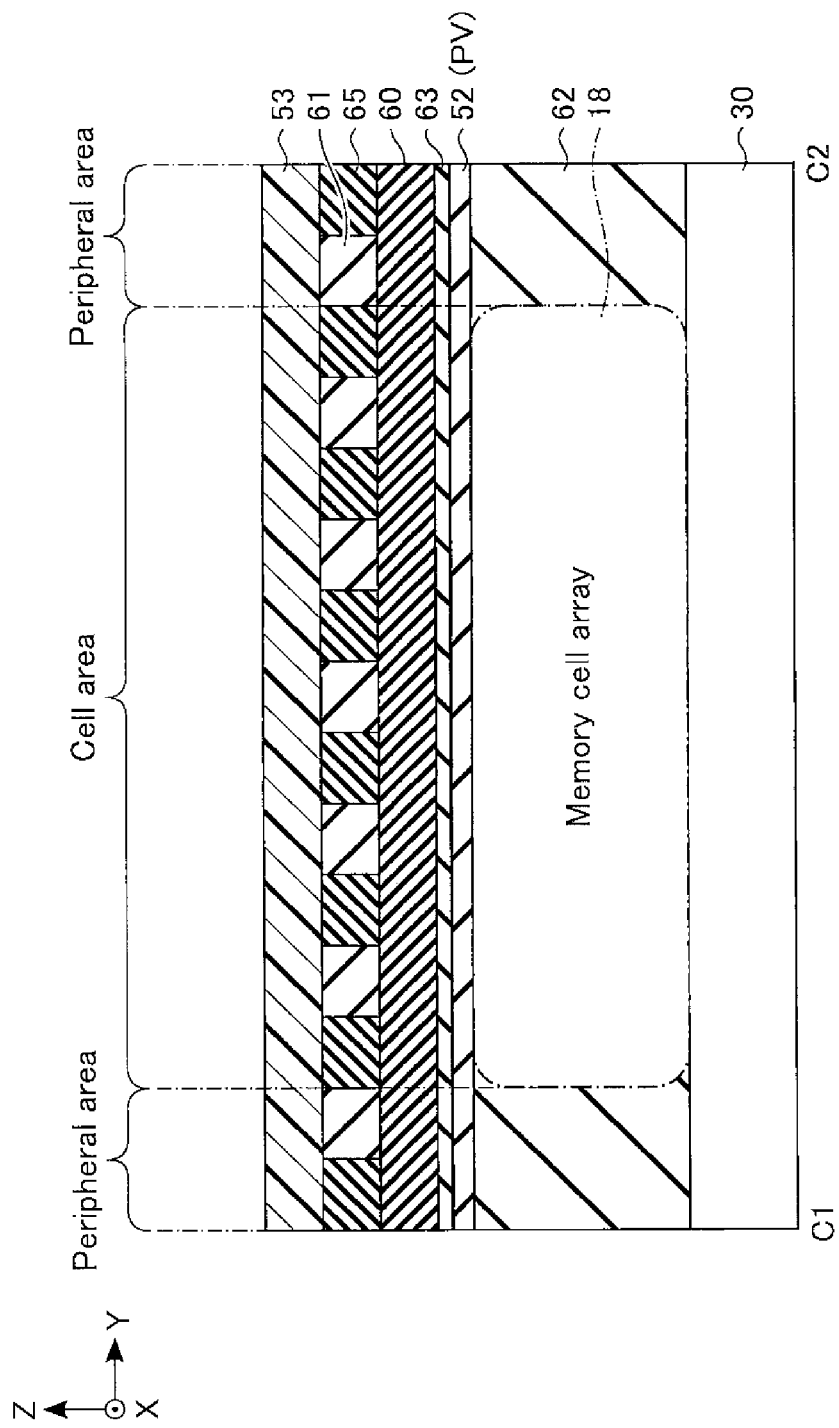
FIG. 23 is a cross-sectional view taken along line C1-C2 in FIG. 21.

Next, a cross-sectional configuration of the semiconductor memory device 1 will be described with reference to FIGS. 22 and 23. FIG. 22 shows a cross-sectional view taken along line B1-B2 in FIG. 21 (hereinafter referred to as "B1-B2 cross section"), that is, a cross-sectional view of the semiconductor memory device 1 in the X-direction. FIG. 23 shows a cross-sectional view taken along line C1-C2 in FIG. 21 (hereinafter referred to as "C1-C2 cross section"), that is, a cross-sectional view of the semiconductor memory device 1 in the Y-direction. The examples shown in FIGS. 22 and 23 omit circuits provided in the peripheral area, to simplify the illustration.

The insulating layer 62 is formed on the semiconductor substrate 30, as shown in FIG. 22. For example, $SiO_2$ is used for the insulating layer 62. The memory cell array 18 is formed in the insulating layer 62.

The insulating layer 52 functioning as the passivation film PV is formed on the insulating layer 62. An insulating layer 63 is formed on the insulating layer 52. The insulating layer 63 functions as an etching stopper used when processing the insulating layers 60 and 61. The insulating layer 63 may be omitted.

A plurality of insulating layers 60 extending in the Y-direction are arranged side by side in the X-direction on the insulating layer 63. An insulating layer 64 is formed between the insulating layers 60. An air gap may be formed between the insulating layers 60.

As shown in FIG. 23, a plurality of insulating layers 61 extending in the X-direction are arranged side by side in the Y-direction on the insulating layers 60 and 64. An insulating layer 65 is formed between the insulating layers 61. An air gap may be formed between the insulating layers 61. Furthermore, the insulating layer 65 may be omitted, and the areas between the insulating layers 61 may be filled with the resin 53.

The resin 53 is formed on the insulating layer 61.

The insulating layers 52, 60, 61, and 63 to 65, and the resin 53 are removed in the PD area, so that the electrode pads PD are exposed.

For example, SiN having a compressive stress is used for the insulating layers 60 and 61. The insulating layer 60 and the insulating layer 61 may employ SiN having different film properties (film stress). Furthermore, the material of the insulating layers 60 and 61 is not limited to SiN. An insulating material that does not function as the passivation film, a semiconductor material, or the like, may be used as long as such a material has a relatively large film stress to control the amount of warp in the semiconductor substrate 30. For example, $SiO_2$ is used for the insulating layers 63 to 65. A semiconductor layer such as amorphous silicon, for example, may be used instead of the insulating layer 63.

The insulating layers 60 and 61 may be formed in the cell area where the insulating layers 60 and 61 effectively reduce the amount of warp in the semiconductor substrate 30, and the insulating layers 60 and 61 in the peripheral area may be removed.

6.4. Method of Manufacturing Semiconductor Memory Device

Next, a method of manufacturing the semiconductor memory device will be described with reference to FIGS. 24 to 27. FIGS. 24 to 27 show B1-B2 cross section and C1-C2 cross section in each step. The examples shown in FIGS. 24 to 27 illustrate mainly the process for producing the insulating layers 60 and 61.

Figure 24:
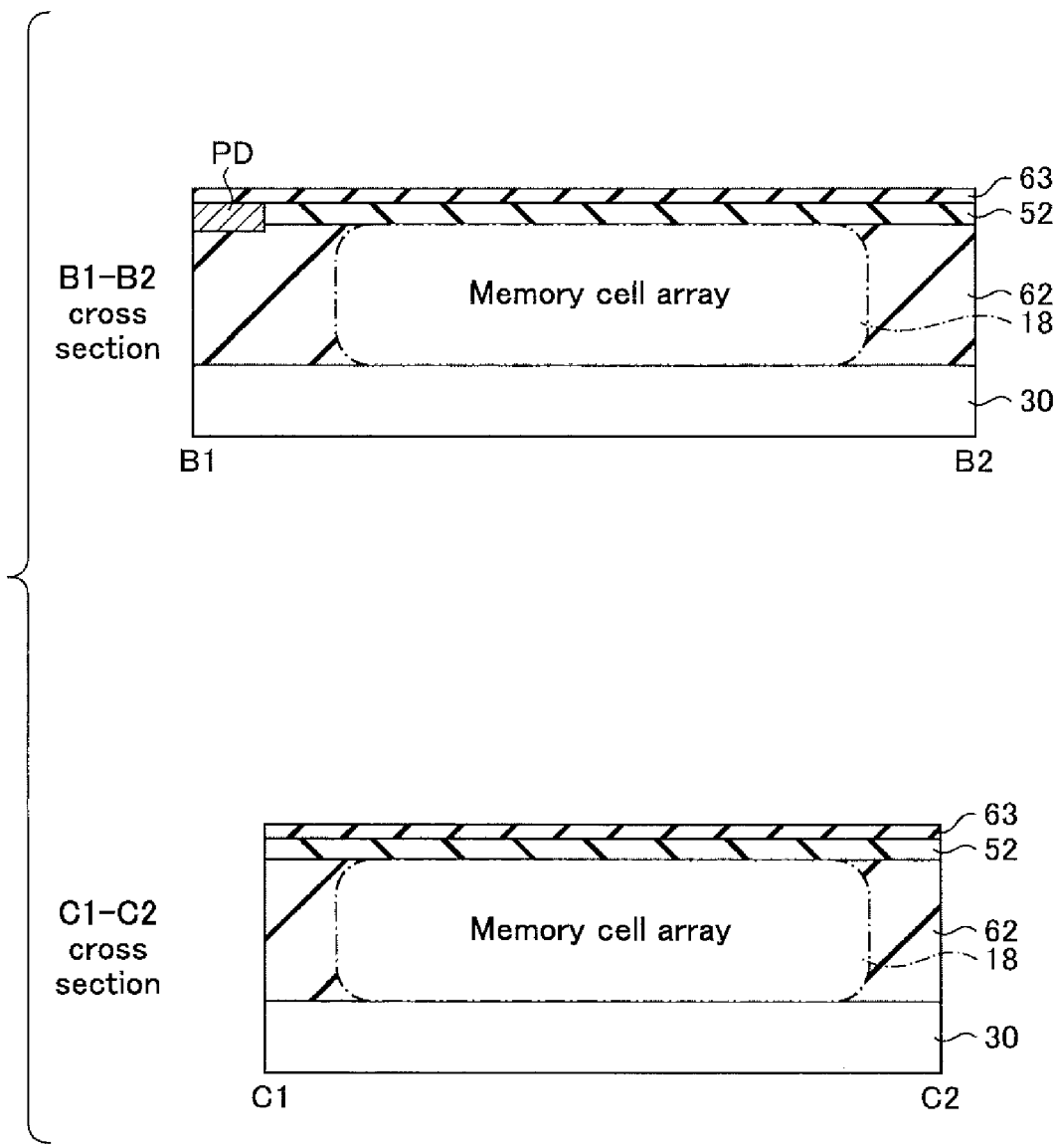

As shown in FIG. 24, the insulating layer 62, the memory cell array 18, etc., are formed on the semiconductor substrate 30. Next, after the insulating layer 52 is formed, the insulating layer 52 in the PD area is removed to form the electrode pad PD. Next, the insulating layer 63 is formed on the electrode pad PD and the insulating layer 52.

As shown in FIG. 25, after the insulating layer 60 is formed on the insulating layer 63, the insulating layer 60 is processed to form a line-and-space pattern (hereinafter referred to as "L/S pattern") extending in the Y-direction.

As shown in FIG. 26, the space in the insulating layer 60 is filled with the insulating layer 64, and the surface of the insulating layer 64 is planarized by performing, for example, chemical mechanical polishing (CMP). Next, after the insulating layer 61 is formed, the insulating layer 61 is processed to form an L/S pattern extending in the X-direction.

Figure 27:
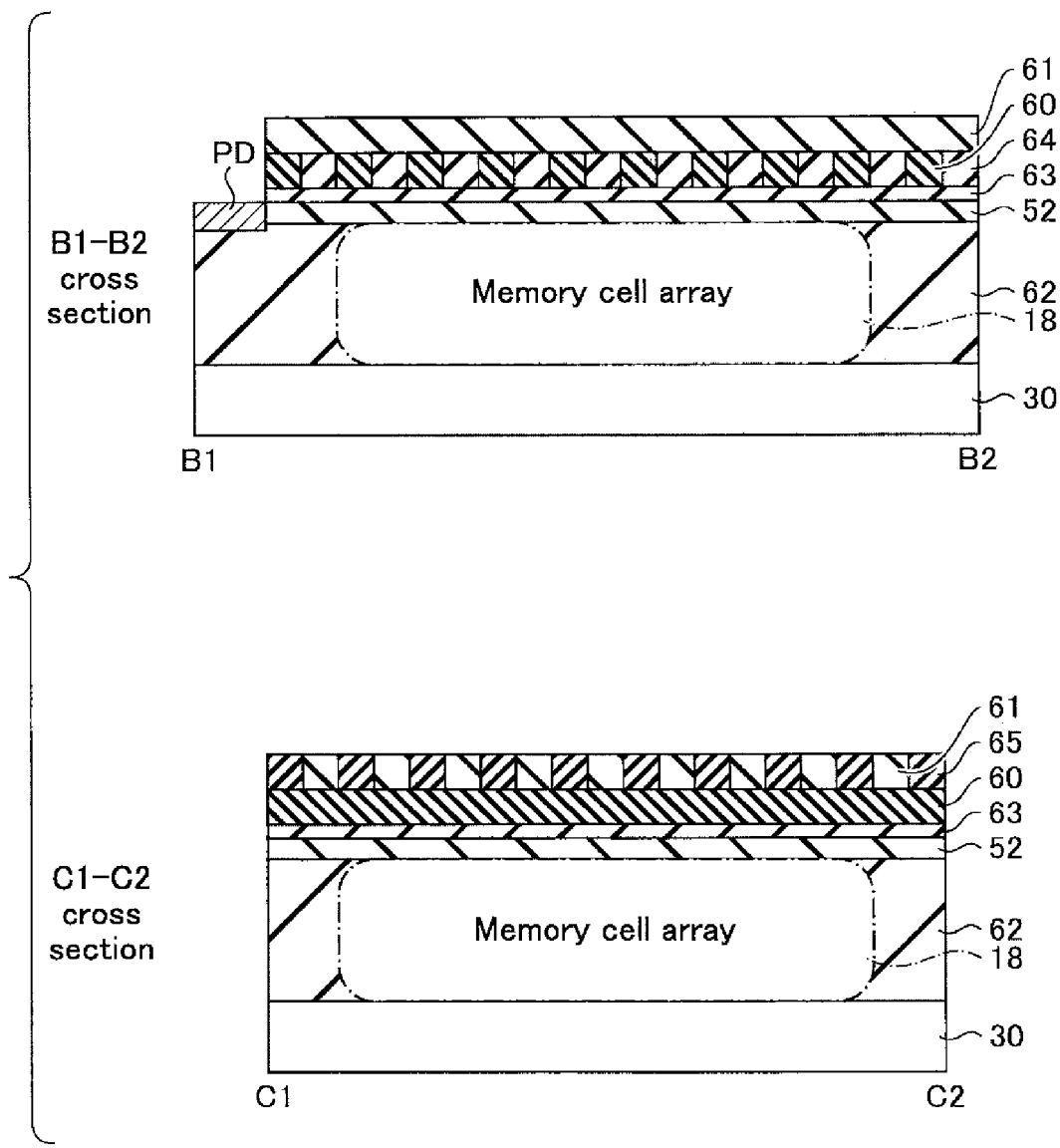

As shown in FIG. 27, the space in the insulating layer 61 is filled with the insulating layer 65, and the surface is planarized. Next, the insulating layers 60, 61, and 63 in the PD area are processed to expose the electrode pad PD. Thereafter, the resin 53 is formed, as shown in FIGS. 22 and 23.

In the present embodiment, the case where the space in the insulating layers 60 is filled with the insulating layer 64 after forming the L/S pattern of the insulating layer 60 is described; however, the L/S pattern of the insulating layer 64 may be formed and then the space in the insulating layer 64 may be filled with the insulating layer 60. The same applies to the method of forming the insulating layers 61 and 65.

Furthermore, when processing the insulating layer 60 to form an L/S pattern, the insulating layer 60 need not be processed until the space passes completely through to the other side. The L/S pattern may be formed while leaving the insulating layer 60 at the bottom thereof, so that the patterns of insulating layer 60 are connected together. The same applies to the insulating layer 61.

6.5. Advantageous Effects of Present Embodiment

The configuration of the present embodiment achieves advantageous effects similar to those of the first to fifth embodiments.

Furthermore, according to the configuration of the present embodiment, the flexibility of design is increased by separately creating the patterns of a plurality of layers that can control the amount of warp in the semiconductor substrate 30. Therefore, even when the remaining stress applied to the semiconductor substrate 30 greatly differs between the X-direction and the Y-direction, for example, the amount of warp in the semiconductor substrate 30 in the X-direction and the Y-direction can be effectively reduced by optimizing the structure of each pattern or a film stress.

7. Other Notes

According to the configuration of the above-described embodiments, a semiconductor memory device includes: a memory cell array (18) that includes a plurality of first interconnect layers (34) and a first memory pillar (MP), the first interconnect layers extending in a first direction (X-direction) substantially parallel to a semiconductor substrate, and the first memory pillar passing through the first interconnect layers and extending in a second direction (Z-direction) substantially perpendicular to the semiconductor substrate; a first insulating layer (51) above the memory cell array; and a passivation film (PV) on the first insulating layer, the passivation film including a protrusion (TR) at least above the memory cell array and between the passivation film and the first insulating layer.

Applying the above-described embodiments can provide a semiconductor memory device with improved yields.

The embodiments are not limited to the configurations described above, but can be modified in various ways.

In the above-described embodiments, the case where one memory cell array 18 is provided is described; however, two or more memory cell arrays 18 may be provided.

Also, in the above-described embodiments, the case where the NAND flash memory is a three-dimensional stacked NAND flash memory; however, the NAND flash memory may be a planar NAND flash memory. Furthermore, a memory other than the NAND flash memory may be adopted, and the embodiments can be applied to a semiconductor device that does not include a memory.

The term "couple" in the above-described embodiments includes indirect coupling via a transistor, a resistor, or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell array that includes a plurality of first interconnect layers and a first memory pillar, the first interconnect layers extending in a first direction substantially parallel to a semiconductor substrate, and the first memory pillar passing through the first interconnect layers and extending in a second direction substantially perpendicular to the semiconductor substrate;
    a passivation film above the memory cell array;
    a plurality of first insulating pattern layers above the passivation film, the first insulating pattern layers extending in the first direction and at least above the memory cell array, and arranged side by side in a third direction that is substantially parallel to the semiconductor substrate and intersects the first direction; and
    a plurality of second insulating pattern layers above the passivation film, the second insulating pattern layers extending in the third direction and at least above the memory cell array, and arranged side by side in the first direction.

2. The semiconductor memory device according to claim 1, wherein the first insulating pattern layers and the second insulating pattern layers have a compressive stress.

3. The semiconductor memory device according to claim 1, further comprising a resin above the first insulating pattern layers and the second insulating pattern layers.

4. The semiconductor memory device according to claim 1, wherein the first memory pillar includes a charge storage layer and a semiconductor layer.

5. The semiconductor memory device according to claim 1, wherein the first insulating pattern layers and the second insulating pattern layers are silicon nitride having a compressive stress.

6. The semiconductor memory device according to claim 5, further comprising:
    an insulating layer provided between the passivation film and the first insulating pattern layers and between the passivation film and the second insulating pattern layers, and including silicon oxide.

7. The semiconductor memory device according to claim 1, further comprising:
    an etching stopper layer provided between the passivation film and the first insulating pattern layers and between the passivation film and the second insulating pattern layers.

8. The semiconductor memory device according to claim 1, further comprising:
    a first insulating layer provided between the first insulating pattern layers and arranged side by side in the third direction; and a second insulating layer provided between the second insulating pattern layers and arranged side by side in the first direction, wherein the first and second insulating layers include silicon oxide.

* * * * *